United States Patent
Gambetta

(10) Patent No.: US 9,509,205 B2
(45) Date of Patent: Nov. 29, 2016

(54) POWER CONVERTER WITH NEGATIVE CURRENT CAPABILITY AND LOW QUIESCENT CURRENT CONSUMPTION

(71) Applicant: Dialog Semiconductor (UK) Limited, London (GB)

(72) Inventor: Pietro Gabriele Gambetta, Livorno (IT)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 14/845,972

(22) Filed: Sep. 4, 2015

(65) Prior Publication Data

US 2016/0181906 A1  Jun. 23, 2016

(30) Foreign Application Priority Data

Dec. 19, 2014 (DE) .......................... 10 2014 226 719

(51) Int. Cl.
| | |
|---|---|
| H02M 1/08 | (2006.01) |
| H03F 3/45 | (2006.01) |
| H02M 3/156 | (2006.01) |
| H02M 1/00 | (2006.01) |

(52) U.S. Cl.
CPC .............. *H02M 1/08* (2013.01); *H02M 3/156* (2013.01); *H03F 3/45076* (2013.01); *H02M 2001/0009* (2013.01); *H03F 2203/45116* (2013.01)

(58) Field of Classification Search
CPC ............................... H02M 1/08; H02M 3/156
See application file for complete search history.

(56) References Cited

U.S. PATENT DOCUMENTS

| | | | | |
|---|---|---|---|---|
| 5,493,533 | A | * 2/1996 | Lambrache | ............ G11C 16/28 365/175 |
| 5,631,595 | A | * 5/1997 | Lakshmikumar | ..... H04L 25/028 327/110 |
| 2006/0255783 | A1 | * 11/2006 | Chapuis | ............. G01R 19/0092 323/282 |
| 2013/0293986 | A1 | * 11/2013 | Lerner | .................... G05F 1/573 361/18 |
| 2014/0210433 | A1 | 7/2014 | Rutkowski et al. | |
| 2014/0253062 | A1 | 9/2014 | Qin | |
| 2014/0253079 | A1 | * 9/2014 | Ding | ..................... H02M 3/156 323/283 |

OTHER PUBLICATIONS

Germany Search Report and Translation 10 2014 226 719.6, May 21, 2015, Dialog Semiconductor (UK) Limited.

* cited by examiner

*Primary Examiner* — Emily P Pham
(74) *Attorney, Agent, or Firm* — Saile Ackerman LLC; Stephen B. Ackerman

(57) ABSTRACT

DC-DC current mode switching power converters that have negative current capability are presented. The power converters comprise: an output node, a pass device connected to the output node of the power converter, the pass device being configured to operate in accordance with a PWM signal and to supply at least a portion of an output current of the power converter, a PWM comparator for generating the PWM signal for controlling operation of the pass device in accordance with a current conducted by the pass device and a difference between an output voltage of the power converter and a reference voltage. The converters have push pull class B (or AB) current sensing, dynamic biasing of a current sense amplifier using error information, and using operational transconductance amplifiers that are fed an error voltage. This results in a lower quiescent current at zero load.

30 Claims, 15 Drawing Sheets

POWER CONVERTER WITH NEGATIVE CURRENT CAPABILITY AND LOW QUIESCENT CURRENT CONSUMPTION

TECHNICAL FIELD

This application relates to power converters that have negative current capability. The application particularly relates to DC-DC current mode switching power converters (e.g. buck converters) that have negative current capability.

BACKGROUND

Power converters, such as DC-DC current mode power converters that convert an input voltage to a typically lower output voltage are known in the art. In DC-DC power converters, the output voltage is typically controlled using a feedback loop (feedback circuit) in dependence on an error voltage and an actual value of a current passing through an output device. Accordingly, control by the feedback loop requires sensing of the current passing through the output device. Sensing negative currents in addition to positive current passing through the output device generally poses a problem for the current sensing circuitry of such power converters.

In Prior art power converters, the current sensing circuitry is biased in class A by means of a bias current to enable sensing of negative currents. The bias current is chosen in accordance with the maximum negative current that is to be sensed. Accordingly, feedback loops of class A power converters dissipate a significant amount of power proportional to the bias current, even at zero load (quiescent current consumption).

SUMMARY

Thus, there is a need for a power converter having negative current capability with reduced current consumption. In view of this need, the present document proposes power converters having the features of the respective independent claims.

Novel aspects of the disclosure relate to push pull class B (or AB) current sensing, dynamic biasing of a current sense amplifier (current sensing circuit) using (voltage) error information, push pull class B (or AB) current sensing using operational transconductance amplifiers that are fed an error voltage, and push pull class B (or AB) current sensing with dynamic biasing of the current sense amplifiers (current sensing circuits) using the (voltage) error information. All of the above novel aspects result in a lower quiescent current at zero load. The last-mentioned of the above novel aspects further has the advantage that differential current sensing is enabled over the full load range.

An aspect of the disclosure relates to a power converter for converting a DC input voltage to a DC output voltage. The power converter may comprise an output node and an output device (pass device, such as a MOS transistor) connected to the output node of the power converter, the pass device being configured to operate (switch) in accordance with a PWM signal and to supply at least a portion of an output current of the power converter. The power converter may further comprise a PWM comparator for generating the PWM signal for controlling operation (switching operation) of the pass device in accordance with a current conducted (passed) by the pass device and a difference between an output voltage of the power converter and a reference voltage. The PWM comparator may have a first input terminal and a second input terminal.

The power converter may further comprise a first current sensing circuit for outputting a first sense current depending on the current conducted by the pass device. The first current sensing circuit may be configured to sense the current conducted by the pass device if the current conducted by the pass device has a given polarity (e.g. positive current, i.e. a current output by the pass device into the load). For instance, the first current sensing circuit may be connected to the pass device (i.e. to the terminals of the pass device) in such a manner that the current conducted by the pass device can be sensed by the first current sensing circuit if the current conducted by the pass device has the given polarity. The first current sensing circuit may be connected to the PWM comparator in such a manner that a voltage depending on the first sense current is supplied to the first input terminal of the PWM comparator. The power converter may yet further comprise a second current sensing circuit for outputting a second sense current depending on the current conducted by the pass device. The second current sensing circuit may be configured to sense the current conducted by the pass device if the current conducted by the pass device has a polarity opposite to the given polarity (e.g. negative current, i.e. a current from the load into the pass device). For instance, the second current sensing circuit may be connected to the pass device (i.e. to the terminals of the pass device) in such a manner that the current conducted by the pass device can be sensed by the second current sensing circuit if the current conducted by the pass device has the polarity opposite to the given polarity. Accordingly, the second current sensing circuit may be said to be connected to the pass device in reverse polarity compared to the first current sensing circuit. The second current sensing circuit may be connected to the PWM comparator in such a manner that a voltage depending on the second sense current is supplied to the second input terminal of the PWM comparator. Accordingly, the first and second current sensing circuits are connected to different input terminals of the PWM comparator. The first and second current sensing circuits may be single-direction (single-ended) current sensing circuits.

Configured as above, the power converter, which may be said to relate to class B push-pull biased current sensing, is capable of sensing the current conducted (passed) by the output device regardless of a polarity of said current. For the given polarity of the current conducted by the output device, only the first current sensing circuitry is operable, i.e. only the first current sensing circuit senses the current conducted by the output device, and for the opposite polarity of the current conducted by the output device, only the second current sensing circuitry is operable, i.e. only the second current sensing circuit senses the current conducted by the output device. That is, for the given polarity of the current conducted by the pass device, the first sense current is non-zero and is used for feedback control of the power converter, while the second sense current is approximately zero. For the opposite polarity of the current conducted by the pass device, the second sense current is non-zero and is used for feedback control of the power converter, while the first sense current is approximately zero. It is not required in the above configuration to apply a significant bias to either one of the first current sense circuit and the second current sense circuit. In consequence, (quiescent) current consumption by the feedback loop of the power converter is reduced, without affecting the power converter's negative current capability.

In embodiments, the first current sensing circuit may comprise a first transistor and a first operational amplifier. The first transistor may be a MOS transistor, for example, such as a PMOS transistor or an NMOS transistor. If the pass device is a PMOS transistor, also the first transistor may be a PMOS transistor, and if the pass device is an NMOS transistor, also the first transistor may be an NMOS transistor. A source terminal of the first transistor may receive a first voltage depending on a voltage at a source terminal of the pass device. An output terminal of the first operational amplifier may be connected to a gate terminal of the first transistor. Further, a positive input terminal of the first operational amplifier may receive a second voltage depending on a voltage at a drain terminal of the pass device (i.e. at the output node), and a negative input terminal of the first operational amplifier may receive the first voltage depending on the voltage at the source terminal of the pass device. The first transistor and the first operational amplifier may be said to form a first voltage follower to the pass device. The second current sensing circuit may comprise a second transistor and a second operational amplifier. The second transistor may be a MOS transistor, for example, such as a PMOS transistor or an NMOS transistor. If the pass device is a PMOS transistor, also the second transistor may be a PMOS transistor, and if the pass device is an NMOS transistor, also the second transistor may be an NMOS transistor. A source terminal of the second transistor may receive a third voltage depending on the voltage at the drain terminal of the pass device (i.e. at the output node). An output terminal of the second operational amplifier may be connected to a gate terminal of the second transistor. Further, a negative input terminal of the second operational amplifier may receive the third voltage depending on the voltage at the drain terminal of the pass device, and a positive input terminal of the second operational amplifier may receive a fourth voltage depending on the voltage at the source terminal of the pass device. The second transistor and the second operational amplifier may be said to form a second voltage follower to the pass device.

The source terminal of the first transistor and the negative input terminal of the first operational amplifier may be connected to the source terminal of the pass device through a first resistance element (first resistor). For the case of the pass device being a PMOS transistor, the source terminal of the pass device, the source terminal of the first transistor, and the negative input terminal of the first operational amplifier may be connected to the supply voltage (Vdd) of the power converter. For the case of the pass device being an NMOS transistor, the source terminal of the pass device, the source terminal of the first transistor, and the negative input terminal of the first operational amplifier may be connected to ground. The positive input terminal of the first operational amplifier may be connected to the drain terminal of the pass device through a second resistance element (second resistor). The source terminal of the second transistor and the negative input terminal of the second operational amplifier may be connected to the drain terminal of the pass device through a third resistance element (third resistor). The positive input terminal of the second operational amplifier may be connected to the source terminal of the pass device through a fourth resistance element (fourth resistor). For the case of the pass device being a PMOS transistor, the source terminal of the pass device and the positive input terminal of the second operational amplifier may be connected to the supply voltage (Vdd) of the power converter. For the case of the pass device being an NMOS transistor, the source terminal of the pass device and the positive input terminal of the second operational amplifier may be connected to ground.

By the above configuration, the first and second current sensing circuits may be implemented in a simple and reliable manner. A gain of the first current sensing circuit and a gain of the second current sensing circuit may be set by appropriate choices of the ratio of the resistance values of the first and second resistors and the ratio of the resistance values of the third and fourth resistors, respectively.

In embodiments, the power converter may further comprise a (compensation) ramp generator for generating a periodic (compensation) ramp signal (current or voltage). The periodic ramp signal may be a saw tooth signal. The ramp generator may be connected to the PWM comparator in such a manner that a voltage depending on the ramp signal is supplied to one of the first and second input terminals of the PWM comparator. The power converter may further comprise an error current generation circuit for generating an error current depending on the difference between the reference voltage and the output voltage of the power converter, i.e. depending on an error voltage. The error current generation circuit may be connected to the PWM comparator in such a manner that a voltage depending on the error current is supplied to the other one of the first and second input terminals. The error current generator may be implemented by an operational transconductance amplifier (OTA).

By adjusting the compensation ramp signal, the modulator gain of the power converter may be set. Providing the compensation ramp signal further allows compensating for sub-harmonic behavior of the feedback loop of the power converter.

In embodiments, the power converter may further comprise a bias current generation circuit for dynamically generating a first bias current depending on a difference between the reference voltage and the output voltage of the power converter (i.e. depending on the error voltage) and for generating a second bias current depending on the difference between the reference voltage and the output voltage of the power converter. The first and second bias currents may have opposite polarities, i.e. at a time when the first bias current is positive, the second bias current is negative, and vice versa. The bias current generation circuit may be connected to the first current sensing circuit to dynamically bias the first current sensing circuit by the first bias current. Biasing of the first sensing circuit may be performed in such a manner that the first current sensing circuit is biased to sense the current conducted by the pass device even for a given range of the current conducted by the pass device for which the current conducted by the pass device has the polarity opposite to the given polarity. For instance, if the first current sensing circuit is configured to sense the current conducted by the pass device if said current is positive, the first current sensing circuit may be biased to be able to also sense said current if said current is negative, at least for a given range of negative currents. Further, the bias current generation circuit may be connected to the second current sensing circuit to dynamically bias the second current sensing circuit by the second bias current. Biasing of the second current sensing circuit may be performed in such a manner that the second current sensing circuit is biased to sense the current conducted by the pass device even for a given range of the current conducted by the pass device for which the current conducted by the pass device has the given polarity. For instance, if the second current sensing circuit is configured to sense the current conducted by the pass device if said current is negative, the second current sensing circuit may be biased to be able to also sense said current if said current is positive, at least for a given range of positive currents.

An output terminal of the bias current generation circuit corresponding to the first bias current may be connected to the positive input terminal of the first operational amplifier, more precisely to an intermediate node between the positive input terminal of the first operational amplifier and the second resistor. An output terminal of the bias current generation circuit corresponding to the second bias current may be connected to the positive input terminal of the second operational amplifier, more precisely to an intermediate node between the positive input terminal of the second operational amplifier and the fourth resistor. The bias current generation circuit may be implemented by a differential OTA. The differential OTA may comprises a first OTA and a second OTA, wherein voltages that are input to the differential OTA are supplied to the first and second OTAs in reverse polarity, i.e. a given one of the input voltages is supplied to a positive input terminal of one of the first and second OTAs and supplied to the negative input terminal of the other one of the first and second OTAs. The first OTA may generate the first bias current and the second OTA may generate the second bias current. Further, (small) constant bias currents may be applied to the first and second current sensing circuits in order to generate an overlap in the transfer functions of the first and second OTAs.

In the power converter configured as above, both the first current sensing circuit and the second current sensing circuit operate (i.e. sense the current conducted by the pass device) simultaneously over the full load range (i.e. both for positive and negative currents) in a differential configuration. This is a result of the first and second bias circuits being biased by, respectively, the first bias current and the second bias current. Accordingly, the feedback loop of the power converter has an enhanced power supply rejection ratio (PSRR) compared to conventional power converters. At the same time, since the first and second current sensing circuits are dynamically biased on the basis of error information relating to the difference between the reference voltage and the output voltage, headroom for sensing a negative current by the first current sensing circuit and headroom for sensing a positive current by the second current sensing circuit is only allowed for when it is actually needed, i.e. when the negative or positive current, respectively, is actually present. Therefore, the quiescent current of the feedback loop at zero load is still very small, so that the overall power consumption of the power converter is reduced.

Another aspect of the disclosure relates to a power converter for converting a DC input voltage to a DC output voltage. The power converter may comprise an output node and an output device (pass device, such as a MOS transistor) connected to the output node of the power converter, the pass device being configured to operate (switch) in accordance with a PWM signal and to supply at least a portion of an output current of the power converter. The power converter may further comprise a PWM comparator for generating the PWM signal for controlling operation (switching operation) of the pass device in accordance with a current conducted (passed) by the pass device and a difference between an output voltage of the power converter and a reference voltage. The PWM comparator may have a first input terminal and a second input terminal.

The power converter may further comprise a first replica of the pass device and a second replica of the pass device. A source terminal of the first replica may be connected to a source terminal of the pass device, and a drain terminal of the first replica may be connected to the PWM comparator in such a manner that a voltage depending on the current conducted by the first replica is supplied to the first input terminal of the PWM comparator. A source terminal of the second replica may be connected to a drain terminal of the pass device, and a drain terminal of the second replica may be connected to the PWM comparator in such a manner that a voltage depending on the current conducted by the second replica is supplied to the second input terminal of the PWM comparator. The power converter may further comprise a bias current generation circuit for generating a bias current depending on the difference between the output voltage of the power converter and the reference voltage, and a switchable circuit assembly for alternatingly connecting the bias current generation circuit to either the drain terminal of the first replica or the drain terminal of the second replica. The switchable circuit assembly may be configured to connect the bias current generation circuit to the drain terminal of the first replica if the output voltage is above the reference voltage (if the load is positive) and to the drain terminal of the second replica if the output voltage is below the reference voltage (if the load is negative). The pass device, the first replica and the second replica may be PMOS transistors. Alternatively, the pass device, the first replica and the second replica may be NMOS transistors.

Configured as above, the power converter is capable of sensing the current conducted (passed) by the output device regardless of a polarity of said current. For the given polarity of the current conducted by the output device, the current output by the first replica is used for feedback control of the power converter, and for the opposite polarity of the current conducted by the output device, the current output by the second replica is used for feedback control of the power converter. It is not required in the above configuration to apply a constant bias to either of the first replica or the second replica, so that (quiescent) current consumption by the feedback loop of the power converter is reduced, without affecting the power converter's negative current capability. In addition, the current conducted by the pass device is sensed directly at the pass device without requiring use of operational amplifiers, which results in a further simplified, smaller configuration and in reduced manufacturing costs.

In embodiments, the bias current generation circuit may comprise a first OTA and a second OTA. The reference voltage may be supplied to the positive terminal of the first OTA and to the negative terminal of the second OTA. Thus, the reference voltage and the output voltage are supplied to the input terminals of the first and second OTAs in opposite (reverse) polarity (order). The output voltage of the power converter may be supplied to the negative terminal of the first OTA and the positive terminal of the second OTA. Further, the output terminal of the first OTA may be switchably connected to the drain terminal of the first replica by the switchable circuit assembly and the output terminal of the second OTA may be switchably connected to the drain terminal of the second replica by the switchable circuit assembly. The output terminal of the first OTA may also be connected to the first input terminal of the PWM comparator and the output terminal of the second OTA may also be connected to the second input terminal of the PWM comparator.

In embodiments, the power converter may further comprise a comparator for generating a signal (a signal for controlling switching of (controllable switches), i.e. a switching signal). The output voltage of the power converter may be supplied to one of input terminals of the comparator and the reference voltage may be supplied to the other one of the input terminals of the comparator. A controllable first switch connected between the output terminal of the first OTA and the drain terminal of the first replica and a controllable second switch connected between the output terminal of the second OTA and the drain terminal of the second replica may be configured to open and close in accordance with the signal, wherein the second switch opens and closes in antiphase to the first switch. To this end, an output terminal of the comparator may be connected to the first switch and the output terminal of the comparator may be further connected to the second switch through an inverter, or vice versa.

Another aspect of the disclosure relates to a power converter for converting a DC input voltage to a DC output voltage. The power converter may comprise an output node and an output device (pass device, such as a MOS transistor) connected to the output node of the power converter, the pass device being configured to operate (switch) in accordance with a PWM signal and to supply at least a portion of an output current of the power converter. The power converter may further comprise a PWM comparator for generating the PWM signal for controlling operation (switching operation) of the pass device in accordance with a current conducted (passed) by the pass device and a difference between an output voltage of the power converter and a reference voltage.

The power converter may further comprise a current sensing circuit for outputting a sense current depending on the current conducted (passed) by the pass device and a bias current generation circuit for dynamically generating a bias current depending on the difference between the output voltage of the power converter and the reference voltage. The current sensing circuit may be configured to sense the current conducted by the pass device if the current conducted by the pass device has a given polarity. For instance, the current sensing circuit may be connected to the pass device (i.e. to the terminals of the pass device) in such a manner that the current conducted by the pass device can be sensed by the current sensing circuit if the current conducted by the pass device has the given polarity. The current sensing circuit may be connected to the PWM comparator in such a manner that a voltage depending on the sense current is supplied to one of input terminals of the PWM comparator. The bias current generation circuit may be connected to the current sensing circuit to dynamically bias the current sensing circuit by the bias current. Biasing of the current sensing circuit may be performed in such a manner that the current sensing circuit is biased to sense the current conducted by the pass device even for a given range of the current conducted by the pass device for which the current conducted by the pass device has a polarity opposite to the given polarity. For instance, if the current sensing circuit is configured to sense the current conducted by the pass device if said current is positive, the current sensing circuit may be biased to be able to also sense said current if said current is negative, at least for a given range of negative currents. The current sensing circuit may be a single-direction (single-ended) current sensing circuit.

Configured as above, the bias current for biasing the current sensing circuit is generated dynamically, by using error information relating to the difference between the reference voltage and the output voltage. Thereby, sensing of the opposite polarity current (e.g. negative current) is enabled only when the opposite polarity current is actually present. In other words, headroom for sensing the negative current by the current sensing circuit is only allowed for when it is actually needed. Therefore, the bias current at zero load is approximately zero, and the quiescent current of the feedback loop at zero load is very small (approximately zero). This results in a reduction of overall power consumption of the power converter without affecting the power converter's negative current capability.

In embodiments, the current sensing circuit may comprise a transistor and an operational amplifier. A source terminal of the transistor may receive a voltage depending on a voltage at a source terminal of the pass device. An output terminal of the operational amplifier may be connected to a gate terminal of the transistor, a positive input terminal of the operational amplifier may receive a voltage depending on a voltage at a drain terminal of the pass device, and a negative input terminal of the operational amplifier may receive the voltage depending on the voltage at the source terminal of the pass device.

By the above configuration, the current sensing circuit may be implemented in a simple and reliable manner. A gain of the current sensing circuit may be set by appropriate choice of the ratio of the resistance values of the first and second resistors.

In embodiments, the power converter may further comprise an error current generation circuit for generating an error current depending on the difference between the output voltage of the power converter and the reference voltage. The error current generation circuit may be connected to the PWM comparator in such a manner that a voltage depending on the error current is supplied to the other one of the input terminals of the PWM comparator. The bias current generation circuit and the error current generation circuit may be formed as the OTAs of a differential OTA.

Providing the bias current generation circuit and the error current generation circuit by the OTAs of a differential OTA, which is a standardized component, results in a simplified configuration and allows reducing a size (area) of the power converter, as well as manufacturing costs.

In embodiments, the power converter may further comprise a (compensation) ramp generator for generating a periodic (compensation) ramp signal (current or voltage). The periodic ramp signal may be a saw tooth signal. The ramp generator may be connected to the PWM comparator in such a manner that a voltage depending on the compensation ramp signal is supplied to the one of the input terminals of the PWM comparator.

By adjusting the compensation ramp signal, the modulator gain of the power converter may be set. Providing the compensation ramp signal further allows compensating for sub-harmonic behavior of the feedback loop of the power converter.

Another aspect of the disclosure relates to a method of controlling a power converter for converting a DC input voltage to a DC output voltage. The power converter may comprise an output node and an output device (pass device, such as a MOS transistor) connected to the output node of the power converter, the pass device being configured to operate (switch) in accordance with a PWM signal and to supply at least a portion of an output current of the power converter. The power converter may further comprise a PWM comparator for generating the PWM signal for controlling operation (switching operation) of the pass device in accordance with a current conducted (passed) by the pass device and a difference between an output voltage of the power converter and a reference voltage. The PWM comparator may have a first input terminal and a second input terminal.

The power converter may further comprise obtaining a first current sensing circuit for outputting a first sense current depending on the current conducted by the pass device and a second current sensing circuit for outputting a second sense current depending on the current conducted by the pass device. The first current sensing circuit may be configured to sense the current conducted by the pass device if the current conducted by the pass device has a given polarity (e.g. positive current, i.e. a current output by the pass device into the load). The second current sensing circuit may be configured to sense the current conducted by the pass device if the current conducted by the pass device has a polarity opposite to the given polarity (e.g. negative current, i.e. a current from the load into the pass device).

The method may comprise obtaining the first sense current by sensing the current conducted by the pass device in case that the current conducted by the pass device has the given polarity, and obtaining the second sense current by sensing the current conducted by the pass device in case that the current conducted by the pass device has the polarity opposite to the given polarity. The method may further comprise supplying a voltage depending on the first sense current to the first input terminal of the PWM comparator and supplying a voltage depending on the second sense current to the second input terminal of the PWM comparator.

Another aspect of the disclosure relates to a method of controlling a power converter for converting a DC input voltage to a DC output voltage. The power converter may comprise an output node and an output device (pass device, such as a MOS transistor) connected to the output node of the power converter, the pass device being configured to operate (switch) in accordance with a PWM signal and to supply at least a portion of an output current of the power converter. The power converter may further comprise a PWM comparator for generating the PWM signal for controlling operation (switching operation) of the pass device in accordance with a current conducted (passed) by the pass device and a difference between an output voltage of the power converter and a reference voltage. The PWM comparator may have a first input terminal and a second input terminal.

The power converter may further comprise a first replica of the pass device and a second replica of the pass device. A source terminal of the first replica may be connected to a source terminal of the pass device, and a drain terminal of the first replica may be connected to the PWM comparator. A source terminal of the second replica may be connected to a drain terminal of the pass device, and a drain terminal of the second replica may be connected to the PWM comparator. The power converter may further comprise a bias current generation circuit for generating a bias current depending on the difference between the output voltage of the power converter and the reference voltage, and a switchable circuit assembly for alternatingly connecting the bias current generation circuit to either the drain terminal of the first replica or the drain terminal of the second replica.

The method may comprise supplying a voltage depending on the current conducted by the first replica to the first input terminal of the PWM comparator and supplying a voltage depending on the current conducted by the second replica to the second input terminal of the PWM comparator. The method may further comprise connecting the bias current generation circuit to the drain terminal of the first replica if the output voltage is above the reference voltage (if the load is positive) and connecting the bias current generation circuit to the drain terminal of the second replica if the output voltage is below the reference voltage (if the load is negative).

Another aspect of the disclosure relates to a method of controlling a power converter for converting a DC input voltage to a DC output voltage. The power converter may comprise an output node and an output device (pass device, such as a MOS transistor) connected to the output node of the power converter, the pass device being configured to operate (switch) in accordance with a PWM signal and to supply at least a portion of an output current of the power converter. The power converter may further comprise a PWM comparator for generating the PWM signal for controlling operation (switching operation) of the pass device in accordance with a current conducted (passed) by the pass device and a difference between an output voltage of the power converter and a reference voltage.

The power converter may further comprise a current sensing circuit for outputting a sense current depending on the current conducted (passed) by the pass device and a bias current generation circuit for dynamically generating a bias current depending on the difference between the output voltage of the power converter and the reference voltage. The current sensing circuit may be configured to sense the current conducted by the pass device if the current conducted by the pass device has a given polarity.

The method may comprise obtaining the sense current by sensing the current conducted by the pass device in case that the current conducted by the pass device has the given polarity. The method may further comprise supplying a voltage depending on the sense current to one of input terminals of the PWM comparator. The method may further comprise dynamically biasing the current sensing circuit by the bias current. Biasing may be performed in such a manner that the current sensing circuit is biased to sense the current conducted by the pass device even for a given range of the current conducted by the pass device for which the current conducted by the pass device has a polarity opposite to the given polarity.

It will be appreciated that method steps and apparatus features may be interchanged in many ways. In particular, the details of the disclosed apparatus can be implemented as a method, as the skilled person will appreciate.

BRIEF DESCRIPTION OF THE DRAWINGS

Embodiments of the disclosure are explained below in an exemplary manner with reference to the accompanying drawings, wherein FIG. 1 schematically illustrates an example of a power converter according to embodiments of the disclosure.

DESCRIPTION

Figure 1:
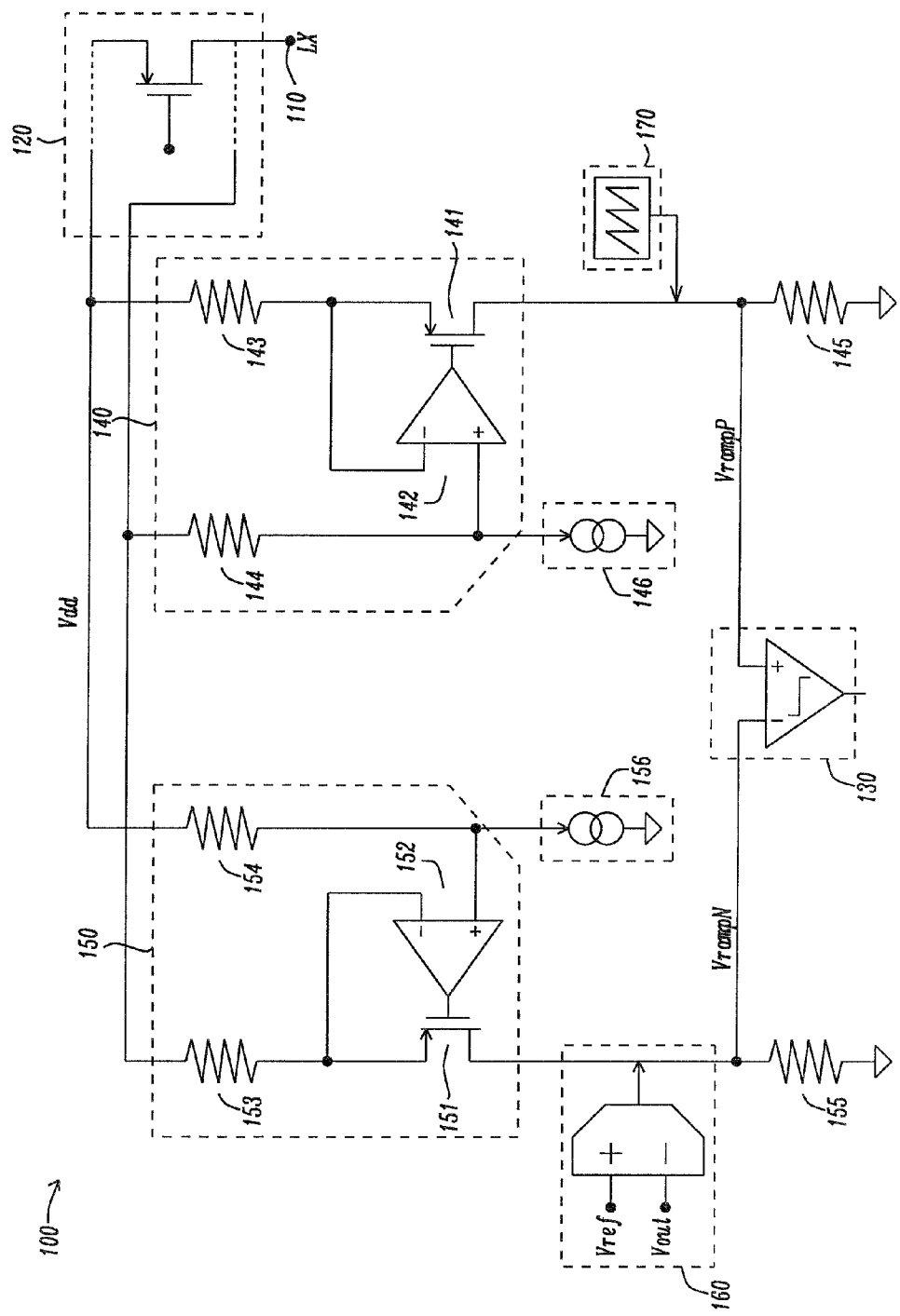

FIG. 1 schematically illustrates an example of a power converter 100 according to embodiments of the disclosure. The power converter 100 comprises an output node 110 and an output device (pass device) 120 connected to the output node 110. The output device 120 supplies at least a portion of an output current of the power converter 100 to the output node 120. The current conducted by the output device 120 may be a positive current or a negative current, depending on the load that is applied to (the output node 110 of) the power converter 100. The output device 120 may have a gate terminal, a source terminal, and a drain terminal, wherein the drain terminal may be connected to the output node 110. The output device 120 may be a MOS transistor, for example, i.e. a PMOS transistor or an NMOS transistor. While the following description and figures relate to the case of the output device 120 being a PMOS transistor, the present disclosure is equally applicable to the case of the output device 120 being an NMOS transistor, with apparent modifications to the described power converter, as the skilled person will appreciate.

The power converter 100 further comprises a PWM comparator 130 that generates a PWM signal for controlling operation (switching operation) of the output device 120. The PWM comparator 130 has first and second input terminals, which may correspond to positive and negative input terminals. The PWM signal may be supplied to a logic (not shown), which in turn may supply a control signal to (the gate terminal of) the output device 120 for controlling switching operation of the output device 120.

The power converter 100 may further comprise a first current sensing circuit 140 that outputs a first sense current, and a second current sensing circuit 150 that outputs a second sense current. The first sense current depends on the current conducted (passed) by the output device 120, and the second sense current depends on the current conducted (passed) by the output device 120. The first and second current sensing circuits 140, 150 are connected to the PWM comparator 130. A voltage depending on the first sense current is received by the first input terminal (e.g. the positive input terminal) of the PWM comparator 130, and a voltage depending on the second sense current is received by the second input terminal (e.g. the negative input terminal) of the PWM comparator 130. To this end, an output terminal of the first current sensing circuit 140 may be connected to ground through a first ground resistance element (first ground resistor) 145, and an intermediate node between the output terminal of the first current sensing circuit 140 and the first ground resistor 145 may be connected to the first input terminal of the PWM comparator 130. Further, an output terminal of the second current sensing circuit 150 may be connected to ground through a second ground resistance element (second ground resistor) 155, and an intermediate node between the output terminal of the second current sensing circuit 150 and the second ground resistor 155 may be connected to the second input terminal of the PWM comparator 130.

The power converter 100 may further comprise a (compensation) ramp generator 170 for generating a periodic (compensation) ramp signal (current or voltage). The compensation ramp signal may be adjusted to set the modulator gain of the feedback loop of the power converter 100 and to compensate for sub-harmonic behavior. An output of the ramp generator 170 may be supplied to the first input terminal of the PWM comparator 130. In this case, the voltage received at the first input terminal of the PWM comparator depends on both the first sense current and the compensation ramp signal, i.e. contains a contribution stemming from the first sense current and a contribution stemming from the compensation ramp signal. To this end, the ramp generator 170 may be connected to the intermediate node between the output terminal of the first current sensing circuit 140 and the first ground resistor 145.

The power converter 100 may further comprise an error current generation circuit 160 that generates an error current. The error current depends on a difference between an actual output voltage (Vout) of the power converter 100 at the output node 110 and a reference voltage (Vref) for the output voltage. The difference Vref−Vout may also be referred to as error voltage in the remainder of the disclosure. The error current generation circuit 160 may be implemented by an operation transconductance amplifier (OTA) that outputs a current proportional to a difference between respective voltages that are supplied to the (positive and negative) input terminals of the OTA. The reference voltage may be supplied to the positive input terminal of the OTA, and the output voltage may be supplied to the negative input terminal of the OTA. An output of the error current generation circuit 160 may be supplied to the second input terminal of the PWM comparator 130. In this case, the voltage received at the second input terminal of the PWM comparator depends on both the second sense current and the error current, i.e. contains a contribution stemming from the second sense current and a contribution stemming from the error current. Alternatively, the polarity of the error current may be chosen opposite, in which case the output of the error current generation circuit 160 would need to be supplied to the first input terminal of the PWM comparator 130, as the skilled person will appreciate.

The first current sensing circuit 140 may be a single-direction (single-ended) current sensing circuit, i.e. a current sensing circuit that is limited to sensing a current having a given direction (sign, polarity). Likewise, the second current sensing circuit 150 may be a single-direction current sensing circuit. The first current sensing circuit 140 may be configured to sense the current conducted by the output device 120 for a given polarity of said current, but not for a polarity opposite to the given polarity. The given polarity may correspond to a positive current being supplied by the output device 120 to the output node 110. The second current sensing circuit 150 may be configured to sense the current conducted by the output device 120 for the polarity opposite to the given polarity of said current, but not for the given polarity. Defining, for each of the first and second current sensing circuits 140, 150, two input terminals and an output terminal, this may be achieved by connecting the source and drain terminals of the output device 120 to the input terminals of the first current sensing circuit 140 in one order, and to the input terminals of the second current sensing circuit 150 in the opposite (reverse) order. In other words, the first and second current sensing circuits may be connected to the output device 120 in opposite (or reverse) polarity.

Figure 2:
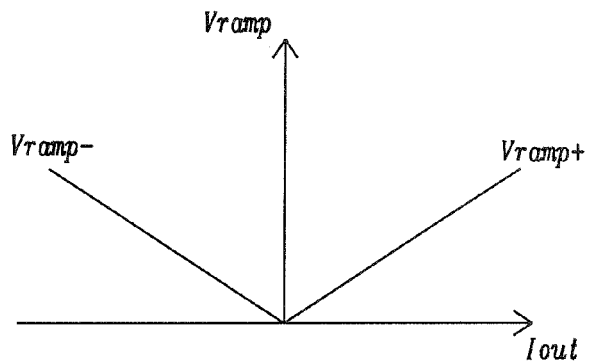
FIG. 2 schematically illustrates an example of a relationship between the output current of the power converter and voltages in the feedback loop of the power converter exemplarily illustrated in FIG. 1.

In the above configuration, regardless of the polarity of the current conducted by the output device 120, either one of the first and second current sensing circuits 140, 150 is active to sense said current, so that the current conducted by the output device 120 can be sensed for either polarity and can be used for feedback control of the power converter 100. Accordingly, assuming the given polarity of the current conducted by the output device 120 to correspond to positive load of the power converter 100, only the first current sensing circuit 140 is operable at positive load while the second current sensing circuit 150 stays unbiased, and only the second current sensing circuit 150 is operable at negative load while the first current sensing circuit 140 stays unbiased. Since the power converter 100 can be feedback controlled for negative output current, it can be said to have negative current capability. Notably, it is not necessary to apply an external bias to either of the first and second current sensing circuits 140, 150 in order to achieve the negative current capability. In consequence, power consumption of the feedback loop of the power converter 100 at zero load is very small, as can be seen in FIG. 2, and overall current consumption of the power converter 100 is reduced.

The first current sensing circuit 140 may comprise a first transistor 141 and a first operational amplifier 142. An output terminal of the first operational amplifier 142 may be connected to a gate terminal of the first transistor 141. A negative input terminal of the first operational amplifier 142 may be connected to a source terminal of the first transistor 141. The first current sensing circuit 140 may further comprise a first resistance element (first resistor) 143 and a second resistance element (second resistor) 144. The first current sensing circuit 140 may be connected to the output device 120 in such a manner that the source terminal of the first transistor 141 and the negative input terminal of the first operational amplifier 142 receive a (first) voltage depending on a voltage at the source terminal of the output device 120, and that a positive input terminal of the first operational amplifier 142 receives a (second) voltage depending on a voltage at the drain terminal of the output device 120 (i.e. at the output node 110). In this configuration, the first transistor 141 and the first operational amplifier 142 may be said to form a voltage follower to the output device 120. The first sense current is output at the drain terminal of the first transistor 141, i.e. the drain terminal of the first transistor 141 can be said to correspond to the output terminal of the first current sensing circuit 140. The source terminal of the first transistor 141 and the negative input terminal of the first operational amplifier 142 may be connected to the source terminal of the output device 120 through the first resistor 143. The positive terminal of the first operational amplifier 142 may be connected to the drain terminal of the output device 120 through the second resistor 144. In this configuration, a gain of the first current sensing circuit 140 depends on a ratio of the resistance values of the first and second resistors 143, 144.

The second current sensing circuit 150 may comprise a second transistor 151 and a second operational amplifier 152. An output terminal of the second operational amplifier 152 may be connected to a gate terminal of the second transistor 151. A negative input terminal of the second operational amplifier 152 may be connected to a source terminal of the second transistor 151. The second current sensing circuit 150 may further comprise a third resistance element (third resistor) 153 and a fourth resistance element (fourth resistor) 154. The second current sensing circuit 150 may be connected to the output device 120 in such a manner that the source terminal of the second transistor 151 and the negative input terminal of the second operational amplifier 152 receive a (third) voltage depending on the voltage at the drain terminal of the output device 120 (i.e. at the output node 110), and that a positive input terminal of the second operational amplifier 152 receives a (fourth) voltage depending on the voltage at the source terminal of the output device 120. In this configuration, the second transistor 151 and the second operational amplifier 152 may be said to form a voltage follower to the output device 120. The second sense current is output at the drain terminal of the second transistor 151, i.e. the drain terminal of the second transistor 151 can be said to correspond to the output terminal of the second current sensing circuit 150. The source terminal of the second transistor 151 and the negative input terminal of the second operational amplifier 152 may be connected to the drain terminal of the output device 120 through the third resistor 153. The positive terminal of the second operational amplifier 152 may be connected to the source terminal of the output device 120 through the fourth resistor 154. In this configuration, a gain of the second current sensing circuit 150 depends on a ratio of the resistance values of the third and fourth resistors 153, 154.

If the output device 120 is a PMOS transistor, the first and second transistors 141, 151 may be PMOS transistors as well, and if the output device 120 is an NMOS transistor, the first and second transistors 141, 151 may be NMOS transistors as well.

While the first and second current sensing circuits 140, 150 can be said to have identical configurations, it is to be noted that the order in which the source terminal and the drain terminal of the output device 120 are connected to the input terminals of the first and second current sensing circuits 140, 150 is reversed, i.e. the first and second current sensing circuits 140, 150 are connected to the output device 120 in opposite (reverse) polarity.

The power converter 100 may further comprise first and second constant current generators 146, 156 for biasing the first and second current sensing circuits 140, 150 by (small and constant) bias currents. An output terminal of the first constant current generator 146 may be connected to an intermediate node between the positive input terminal of the first operational amplifier 142 and the second resistor 144, so that a voltage level of the positive input terminal of the first operational amplifier 142 may be lowered with respect to a supply voltage Vdd of the power converter 100 for the case of the output device 120 being a PMOS transistor (in which case a positive current would be drained (sinked/pulled) by the first constant current generator 146), or raised with respect to ground in the case of the output device 120 being an NMOS transistor (in which case a positive current would be sourced/pushed by the first constant current generator 146). Likewise, an output terminal of the second constant current generator 156 may be connected to an intermediate node between the positive input terminal of the second operational amplifier 152 and the fourth resistor 154, so that a voltage level of the positive input terminal of the second operational amplifier 152 may be lowered with respect to a supply voltage Vdd of the power converter 100 for the case of the output device 120 being a PMOS transistor (in which case a positive current would be sinked/pulled by the second constant current generator 156), or raised with respect to ground in the case of the output device 120 being an NMOS transistor (in which case a positive current would be sourced/pushed by the second constant current generator 156). While applying these bias currents is not necessary in the context of enabling the negative current capability of the power converter 100, doing so may improve stability of feedback control by the feedback loop of the power converter 100, as will be explained in more detail below.

FIG. 2 schematically illustrates an example of a relationship between the output current (Iout; more precisely, the current conducted by the output device 120) and the voltages (Vramp+, Vramp−) at respective input terminals of the PWM comparator 130. As can be seen from FIG. 2, the voltage Vramp+ at the first input terminal (e.g. the positive input terminal) of the PWM comparator 130 is approximately zero for negative Iout (negative load) and rises linearly for positive Iout (positive load), while the voltage Vramp− at the second input terminal (e.g. the negative input terminal) of the PWM comparator 130 falls linearly for negative Iout (negative load) and is approximately zero for positive Iout (positive load). At zero Iout (zero load), both voltages Vramp+ and Vramp− are approximately zero, resulting in negligible current consumption at zero load.

Figure 3:
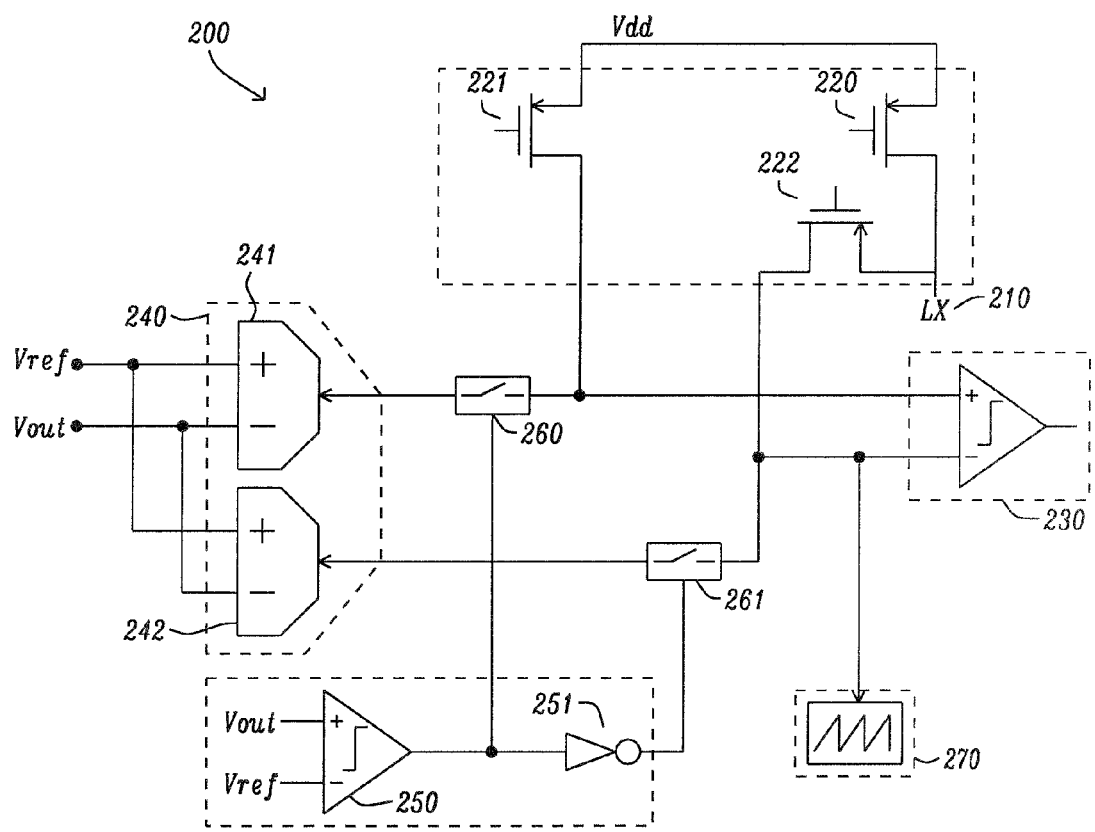
FIG. 3 schematically illustrates another example of a power converter according to embodiments of the disclosure.

FIG. 3 schematically illustrates another example of a power converter 200 according to embodiments of the disclosure. The power converter 200 comprises an output node 210, an output device (pass device) 220, and a PWM comparator 230. The function and configuration of the output device 220, output node 210, and PWM comparator 230 are identical to those of the output device 120, output node 110, and PWM comparator 130 described above with reference to FIG. 1.

The power converter 200 may further comprise a first (scaled) replica 221 of the output device 220 and a second (scaled) replica 222 of the output device 220. If the output device 220 is a PMOS transistor or an NMOS transistor, also the first and second replica 221, 221 are PMOS transistors or NMOS transistors, respectively, as the name replica suggests. A source terminal of the first replica 221 may be connected to a source terminal of the output device 220. A source terminal of the second replica 222 may be connected to a drain terminal of the output device 220 (i.e. to the output node 210). A drain terminal of the first replica 221 may be connected to the PWM comparator 230 in such a manner that the first input terminal of the PWM comparator 230 receives a voltage depending on a current conducted by the first replica 221 (i.e. a current output at the drain terminal of the first replica 221). Further, a drain terminal of the second replica 222 may be connected to the PWM comparator 230 in such a manner that the second input terminal of the PWM comparator 230 receives a voltage depending on a current conducted by the second replica 222 (i.e. a current output at the drain terminal of the second replica 222). In this configuration, the current output by the first replica 221 is a scaled version of the current conducted by the output device 220, and the current conducted by the second replica 222 is a scaled version of the current conducted by the output device 220. The scaling ratios depend on a ratio between a resistance value of the first replica 221 and the output device 220, and a ratio between a resistance value of the second replica 222 and the output device 220, respectively. In other words, the current conducted by the output device 220 is directly sensed on the output device 220 without using operational amplifiers as was the case in the power converter 100 described above with reference to FIG. 1.

The power converter 200 may further comprise a bias current generation circuit 240 that generates a (dynamic) bias current. The bias current may depend on the difference between the output voltage (Vout) of the power converter 220 and the reference voltage (Vref). More precisely, (the magnitude of) the bias current may be proportional to said difference. The bias current may have a given polarity regardless of the sign of said difference. The bias current generation circuit 240 may be switchably connected either to the drain terminal of the first replica 221 (and the first input terminal of the PWM comparator 230), or to the drain terminal of the second replica 222 (and the second input terminal of the PWM comparator 230) by a switchable circuit assembly. Therein, the switchable circuit assembly may have such configuration that the bias current generation circuit 240 is connected to the drain terminal of the first replica 221 if the load of the power converter 200 is positive (i.e. if the output voltage is above the reference voltage, or the output current is positive) and to the drain terminal of the second replica 222 if the load is negative (i.e. if the output voltage is below the reference voltage, or the output current is negative).

The bias current generation circuit 240 may be formed by a differential OTA that comprises a first OTA 241 and a second OTA 242. For the case of the output device 220 being a PMOS, the output voltage of the power converter 200 may be supplied to a positive input terminal of the first OTA 241 and to a negative input terminal of the second OTA. The reference voltage may be supplied to a negative input terminal of the first OTA 241 and to a positive input terminal of the second OTA 242. For the case of the output device 220 being an NMOS transistor, the output voltage and the reference voltage would be supplied to the input terminals of the first and second OTAs 241, 242 in reverse polarity.

In the above configuration, the first OTA 241 generates a first bias current at its output terminal, and the second OTA 242 generates a second bias current at its output terminals. Both the first and second bias currents depend on the difference between the output voltage and the reference voltage. More precisely, both the first and the second bias currents are proportional to said difference. Notably, the first and second bias currents have opposite direction (polarity).

The switchable circuit assembly may comprise a (controllable) first switch 260 and a (controllable) second switch 261, and may further comprise a comparator 250 and an inverter 251. The first switch 260 may be connected between the output terminal of the first OTA 241 and the first input terminal of the PWM comparator 230, more precisely between the output terminal of the first OTA 241 and an intermediate node between the drain terminal of the first replica 221 and the first input terminal of the PWM comparator 230. The second switch 261 may be connected between the output terminal of the second OTA 242 and the second input terminal of the PWM comparator 230, more precisely between the output terminal of the second OTA 242 and an intermediate node between the drain terminal of the second replica 222 and the second input terminal of the PWM comparator 230.

The comparator 250 may receive the output voltage and the reference voltage at its input terminals and output a signal (a signal for controlling switching of the first and second switches 260, 261, i.e. a switching signal) in accordance with a difference between the output voltage and the reference voltage. The first and second switches 260, 261 may be controllable switches and may be controlled to open and close in accordance with the signal. Therein, the second switch 261 may open and close in antiphase to the first switch 260. To this end, the signal output by the comparator 250 may be fed directly to the first switch 260 and may be supplied to the inverter 251 before it is fed to the second switch 261 (or vice versa, depending on respective input terminals of the comparator 250 to which the output voltage and the reference voltage are supplied, as the skilled person will appreciate).

In the above configuration, when the load of the power converter 200 is positive, the first switch 260 closes and the second switch 261 opens so that the first bias current is "pulled" from the drain terminal of the first replica 222. On the other hand, when the load of the power converter 200 is negative, the first switch 260 opens and the second switch 261 closes, so that the second bias current is "pulled" from the drain terminal of the second replica 222.

Accordingly, a positive current is pulled from either the drain terminal of the first replica 221 or the drain terminal of the second replica 222, depending on a sign of the load of the power converter 200 (or equivalently, depending on a sign/polarity of the current conducted by the output device 220). The bias current defined above may be thus said to be constituted by the first bias current for positive load and by the second bias current for negative load. As will be appreciated by the skilled person, voltage supplies to the input terminals of the comparator 250 and the first and second OTAs 241, 241 may be swapped between positive and negative input terminals in various combinations, as long as it is ensured that a positive current, the magnitude of which depends on (is proportional to) the difference between the output voltage and the reference voltage is drained from the first replica 221 (a replica for sensing positive current) for positive load and from the second replica 222 (a replica for sensing negative current) for negative load.

While the above description (unless indicated otherwise) relates to the case of the output device 220 being a PMOS transistor, it will be appreciated by the skilled person that in the case of the output device 120 being an NMOS transistor, a positive current would need to be "pushed" to the first and second replica 221, 222.

The power converter 200 may further comprise a (compensation) ramp generator 270 for generating a periodic (compensation) ramp signal (current or voltage). The function and configuration of the ramp generator 270 are identical to those of the ramp generator 170 described above with reference to FIG. 1. An output of the ramp generator 270 may be supplied to either one of the first and second input terminals of the PWM comparator 230.

Figure 4:
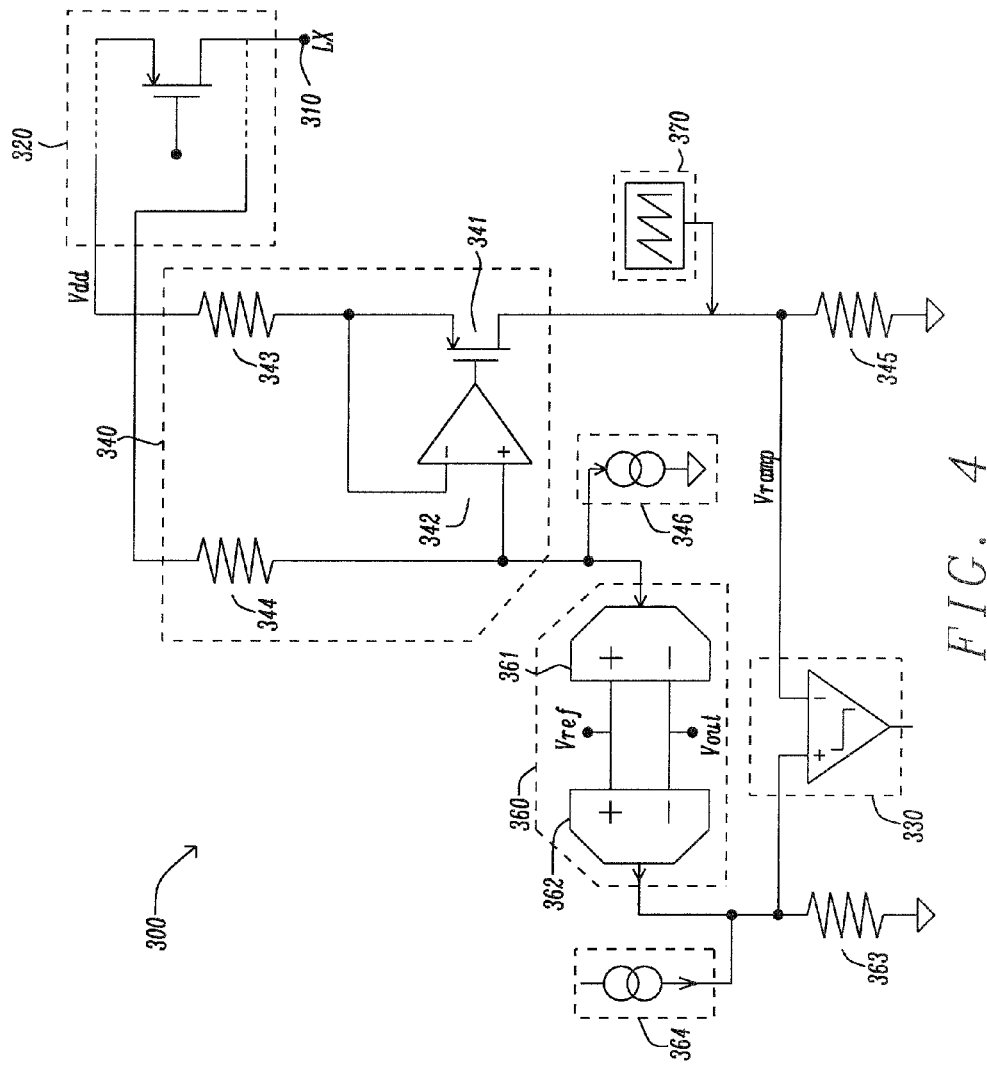
FIG. 4 schematically illustrates another example of a power converter according to embodiments of the disclosure.

FIG. 4 schematically illustrates another example of a power converter 300 according to embodiments of the disclosure. The power converter 300 comprises an output node 310, an output device (pass device) 320, and a PWM comparator 330. The function and configuration of the output device 320, output node 310, and PWM comparator 330 are identical to those of the output device 120, output node 110, and PWM comparator 130 described above with reference to FIG. 1. The power converter 300 may further comprise first and second ground resistance elements (first and second ground resistors) 345, 363 that serve the same purpose as respective first and second ground resistors 145, 155 described above with reference to FIG. 1.

The power converter 300 may further comprise a current sensing circuit 340, the function and configuration of which correspond to those of the first current sensing circuit 140 described above with reference to FIG. 1. The current sensing circuit 340 may output a sense current depending on the current conducted (passed) by the output device 320. The current sensing circuit 340 may be connected to the PWM comparator 330. A voltage depending on the sense current may be received by an input terminal of the PWM comparator 330.

The current sensing circuit 340 may be a single-direction (single-ended) current sensing circuit, i.e. a current sensing circuit that is limited to sensing a current having a given direction (sign, polarity). The current sensing circuit 340 may be configured to sense the current conducted by the output device 320 for a given polarity of said current, but not for a polarity opposite to the given polarity. The given polarity may correspond to a positive current being supplied by the output device 320 to the output node 310.

The current sensing circuit 340 may comprise a transistor 341, an operational amplifier 342, a first resistance element (first resistor) 343 and a second resistance element (second resistor) 344, which respectively correspond to the first transistor 141, first operational amplifier 142, first resistor 143, and second resistor 344, as described above with reference to FIG. 1.

The power converter 300 may further comprise a bias current generation circuit 361 that generates a (dynamic) bias current depending on a difference between the output voltage at the output node 310 and the reference voltage. The bias generation circuit 361 may be connected to the current sensing circuit 340 to dynamically bias the current sensing circuit 340 by the bias current. The current sensing circuit 340 may be biased by the bias current generation circuit 361 in such a manner that the current sensing circuit 340 is enabled to sense the current conducted by the output device 320 also for a polarity of said current opposite to the given polarity.

An output terminal of the bias current generation circuit 361 may be connected to the positive input terminal of the operational amplifier 342, more precisely to the intermediate node between the positive input terminal of the operational amplifier 342 and the second resistor 344, so that a voltage level of the positive input terminal of the operational amplifier 342 may be lowered with respect to a supply voltage Vdd of the power converter 300 for the case of the output device 320 being a PMOS transistor (in which case a current would be sinked/pulled by the bias current generation circuit 361), or raised with respect to ground in the case of the output device 320 being an NMOS transistor (in which case a current would be sourced/pushed by the bias current generation circuit 361).

The bias current generation circuit 361 may be embodied by a first OTA 361, to the input terminals of which the output voltage and the reference voltage are supplied. The first OTA 361 may be comprised by a differential OTA 360. For the case of the output device 320 being a PMOS transistor, the output voltage would be supplied to the positive input terminal of the first OTA 361 and the reference voltage would be supplied to the negative input terminal of the first OTA 361. For the case of the output device 320 being an NMOS transistor, the output voltage and the reference voltage would be supplied to the input terminals of the first OTA 361 in reverse polarity.

According to the above configuration, a positive current is sinked/pulled by the first OTA 361 for negative load (negative current). Said current is a dynamic bias current that is proportional to the difference between the output voltage and the reference voltage. In other words, the error information relating to the difference between the reference voltage and the output voltage is used to dynamically bias the current sensing circuit 340, thereby allowing headroom for sensing a negative current only when the negative current is actually present.

By the above configuration, the voltage level at the positive input terminal of the operational amplifier 342 is lowered with respect to the supply voltage of the power converter 300 and the negative current may be sensed by the current sensing circuit 340. While the above relates to the case of the output device 320 being a PMOS transistor, a positive current would be sourced/pushed by the first OTA 361 for the case of the output device 320 being an NMOS transistor. Since the bias current is only applied to the current sensing circuit 340 by the first OTA 361 for negative load, current consumption at zero load is very small also in this configuration. In fact, for negative load the output voltage rises due to load regulation. This is captured by the first OTA 361 which dynamically generates the bias current. As indicated above, this allows for headroom for sensing a negative current only when it is needed.

The power converter 300 may further comprise a constant current generator 346 for biasing the current sensing circuit 340 by a (small and constant) bias current. An output terminal of the constant current generator 346 may be connected to the intermediate node between the positive input terminal of the operational amplifier 342 and the second resistor 344, so that a voltage level of the positive input terminal of the operational amplifier 342 may be lowered with respect to a supply voltage Vdd of the power converter 300 for the case of the output device 320 being a PMOS transistor (in which case a current would be sinked/pulled by the constant current generator 346), or raised with respect to ground in the case of the output device 320 being an NMOS transistor (in which case a current would be sourced/pushed by the constant current generator 346). While applying the bias current is not necessary in the context of enabling the negative current capability of the power converter 300, doing so may improve stability of feedback control by the feedback loop of the power converter 300. The power converter 300 may further comprise a second constant current generator 364 sourcing/pushing a (small and constant) current towards the second input terminal of the PWM comparator 330.

The power converter 300 may comprise an error current generation circuit 362 that generates an error current depending on the difference between the output voltage and the reference voltage. The error current and the bias current may have opposite polarities. In this case, the error current would be supplied to the second input terminal of the operational amplifier 330 so that a voltage at the second terminal of the operational amplifier 330 depends on the error current. The error current generation circuit 362 may be embodied by a second OTA 362. The second OTA 362 may be comprised by the differential OTA 360. In this case, the reference voltage would be supplied to the positive input terminal of the second OTA 362, and the output voltage would be supplied to the negative input terminal of the second OTA 362.

The power converter 300 may further comprise a (compensation) ramp generator 370 for generating a periodic (compensation) ramp signal (current or voltage). The function and configuration of the ramp generator 370 are identical to those of the ramp generator 170 described above with reference to FIG. 1. An output of the ramp generator 370 may be supplied to either one of the first and the second input terminals of the PWM comparator 330.

Figure 5A:
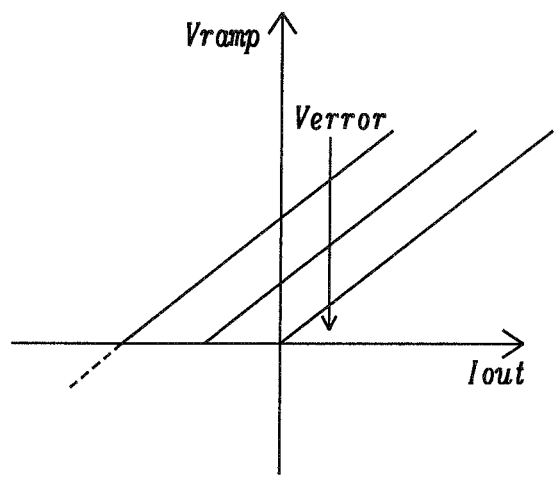
FIG. 5A and FIG. 5B schematically illustrate an example of a relationship between the output current and voltages in the feedback loop of the power converter exemplarily illustrated in FIG. 4 and a relationship between a quiescent current and a difference between the reference voltage and the output voltage of the power converter exemplarily illustrated in FIG. 4, respectively.
Figure 5B:
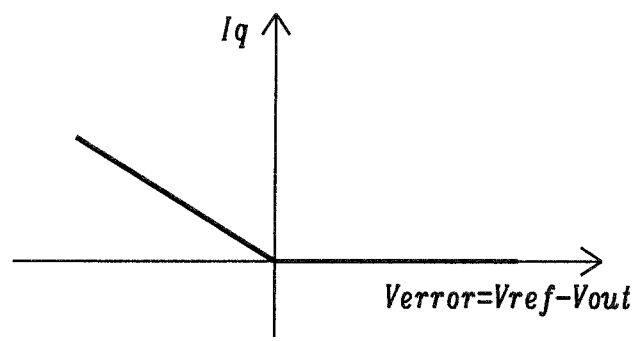

FIG. 5A schematically illustrates an example of a relationship between the output current (Iout) of the power converter and a voltage (Vramp) in the feedback loop of the power converter 300, and FIG. 5B schematically illustrates a relationship between the quiescent current (Iq) and the error voltage (Verror), which corresponds to a difference between the reference voltage (Vref) and the output voltage (Vout) of the power converter 300. As can be seen from FIGS. 5A and 5B, the quiescent current is proportional to (−1) times the error voltage and is approximately zero at zero load.

Figure 6:
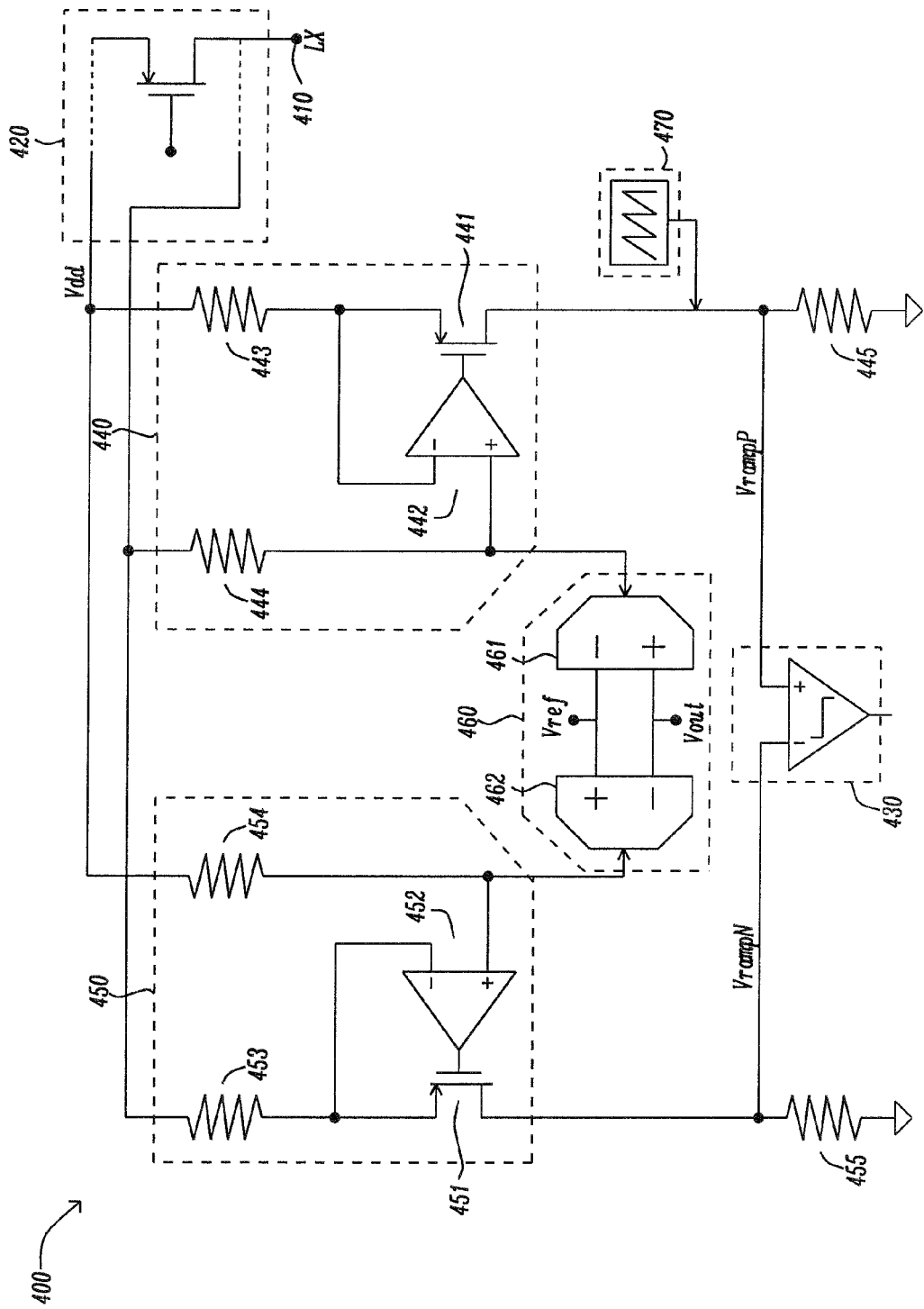
FIG. 6 schematically illustrates another example of a power converter according to embodiments of the disclosure.

FIG. 6 schematically illustrates another example of a power converter 400 according to embodiments of the disclosure. The power converter 400 comprises an output node 410, an output device (pass device) 420, and a PWM comparator 430. The function and configuration of the output device 420, output node 410, and PWM comparator 430 are identical to those of the output device 120, output node 110, and PWM comparator 130 described above with reference to FIG. 1. The power converter 400 may further comprise first and second ground resistance elements (first and second ground resistors) 445, 455 that serve the same purpose as respective first and second ground resistors 145, 155 described above with reference to FIG. 1.

The power converter 400 may comprise first and second current sensing circuits 440, 450 and a (compensation) ramp generator 470. The function and configuration of the first and second current sensing circuits 440, 450 and the ramp generator 470 are identical to those of first and second current sensing circuits 140, 150 and the ramp generator 170 described above with reference to FIG. 1. In particular, the first current sensing circuit 440 may be a single-direction current sensing circuit capable of sensing the current conducted by the output device 420 for a given polarity of said current, but not for the opposite polarity. Likewise, the second current sensing circuit 450 may be a single-direction current sensing circuit capable of sensing the current conducted by the output device 420 for a polarity opposite to the given polarity, but not for the given polarity. Further, the first current sensing circuit 440 may comprise a first transistor 441, a first operational amplifier 442, a first resistance element (first resistor) 443 and a second resistance element (second resistor) 444, the connections among which and to the output device 420 are identical to respective connections of the constituents of the first current sensing circuit 140 described above with reference to FIG. 1. Likewise, the second current sensing circuit 450 may comprise a second transistor 451, a second operational amplifier 452, a third resistance element (third resistor) 453 and a fourth resistance element (fourth resistor) 454, the connections among which and to the output device 420 are identical to respective connections of the constituents of the second current sensing circuit 150 described above with reference to FIG. 1.

The power converter 400 may further comprise a bias current generation circuit 460 that dynamically generates a first bias current and a second bias current that both depend on a difference between the reference voltage (Vref) and the output voltage (Vout). The first and second bias currents may have opposite polarities. The bias current generation circuit 460 may be connected to the first current sensing circuit 440 to dynamically bias the first current sensing circuit 440 by the first bias current in such a manner that the first current sensing circuit 440 is enabled to sense the current conducted by the output device 420 also for the polarity opposite to the given polarity, at least for a certain range of said current. Likewise, the bias current generation circuit 460 may be connected to the second current sensing circuit 450 to dynamically bias the second current sensing circuit 440 by the second bias current in such a manner that the second current sensing circuit 450 is enabled to sense the current conducted by the output device 420 also for the given polarity, at least for a certain range of said current.

The bias current generation circuit 460 may be embodied by a differential OTA 460 comprising a first OTA 461 and a second OTA 462. The first OTA 461 may generate the first bias current, and the second OTA 462 may generate the second bias current. The voltages supplied to the differential OTA are supplied to the input terminals of the first and second OTAs 461, 462 in opposite (reverse) polarity. That is, the output voltage may be supplied to the positive input terminal of the first OTA 461 and to the negative input terminal of the second OTA 462, and the reference voltage may be supplied to the negative input terminal of the first OTA 461 and to the positive input terminal of the second OTA 462. While the above relates to the case of the output device 420 being a PMOS transistor, input terminals of the first and second OTAs 461, 462 would need to be swapped for the case of the output device 420 being an NMOS transistor, as the skilled person will appreciate. The output terminal of the first OTA 461 may be connected to the positive input terminal of the first operational amplifier 442, more precisely to an intermediate node between the positive input terminal of the first operational amplifier 442 and the second resistor 444. The output terminal of the second OTA 462 may be connected to the positive input terminal of the second operational amplifier 452, more precisely to an intermediate node between the positive input terminal of the second operational amplifier 452 and the fourth resistor 454.

In this configuration, a positive current, the magnitude of which depends on the difference between the reference voltage and the output voltage, is sinked/pulled by the first OTA 461 from the first current sensing circuit 440 for negative loads, thereby enabling sensing of a negative current (i.e. a current having the polarity opposite to the given polarity) by the first current sensing circuit 440. Further, a positive current, the magnitude of which depends on the difference between the reference voltage and the output voltage, is sinked/pulled by the second OTA 462 from the second current sensing circuit 450 for positive loads, thereby enabling sensing of a positive current (i.e. a current having the given polarity) by the second current sensing circuit 440.

Accordingly, each of the first and second current sensing circuits 440, 450 is dynamically biased using the error information relating to the difference between the reference voltage and the output voltage. Thereby, headroom for sensing a negative current by the first current sensing circuit 440 is allowed for only when the negative current is actually present, and headroom for sensing a positive current by the second current sensing circuit 450 is allowed for only when the positive current is actually present. At zero load, no bias current is applied, and quiescent current consumption of the power converter 400 is reduced.

In other words, the two opposite-phase current sensing circuits 440, 450 are biased via two current branches, again in opposite phase, so that at zero load the quiescent current is approximately zero. The first and second OTAs 461, 462 and first and second current sensing circuits 440, 450 are unipolar. When the load rises (becomes more positive), the first current sensing circuit 440 feeds current information to the first input terminal of the PWM comparator 430 (i.e. to the VrampP node in FIG. 6). The second current sensing circuit 450 would get choked because of the unipolar biasing (the Lx node falling tends to shut off the follower (e.g. PMOS follower) of the second current sensing circuit 450), but the second OTA 462 will start sinking the second bias current, thereby biasing the second current sensing circuit 450 and allowing it to work. The first OTA 461 is off during this period. For negative loads the opposite happens. When the load decreases (becomes more negative), the second current sensing circuit 450 feeds current information to the second input terminal of the PWM comparator 430 (i.e. to the VrampN node in FIG. 6). The first current sensing circuit 440 would get choked because of the unipolar biasing (the Lx node rising tends to shut off the follower (e.g. PMOS follower) of the first current sensing circuit 440), but the first OTA 461 will start sinking the first bias current, thereby biasing the first current sensing circuit 440 and allowing it to work. The second OTA 462 is off during this period. The respective currents sinked by the first and second OTAs 461, 462 are illustrated in FIGS. 7A and 7B.

Figure 7A:
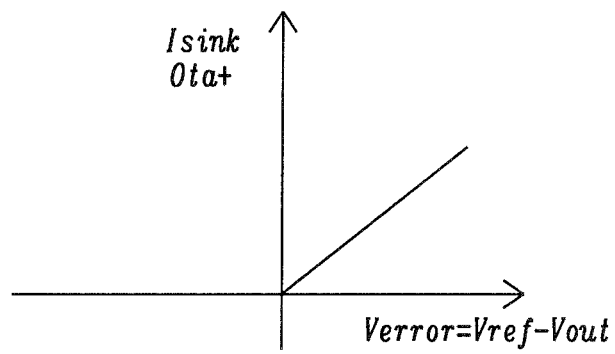
FIG. 7A and FIG. 7B schematically illustrate examples of relationships between respective dynamic bias currents and the difference between the reference voltage and the output voltage of the power converter exemplarily illustrated in FIG. 6.
Figure 7B:
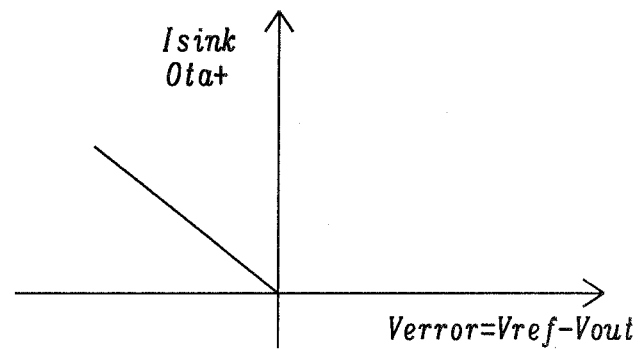

FIG. 7A schematically illustrates an example of a relationship between the current sinked by the second OTA 462, i.e. the second bias current (Isink Ota+) and the error voltage (Verror), which corresponds to a difference between the reference voltage (Vref) and the output voltage (Vout) of the power converter. FIG. 7B schematically illustrates an example of a relationship between the current sinked by the first OTA 461, i.e. the first bias current (Isink Ota−) and the error voltage (Verror). As can be seen from FIGS. 7A and 7B, no bias current is present at zero load.

Figure 8:
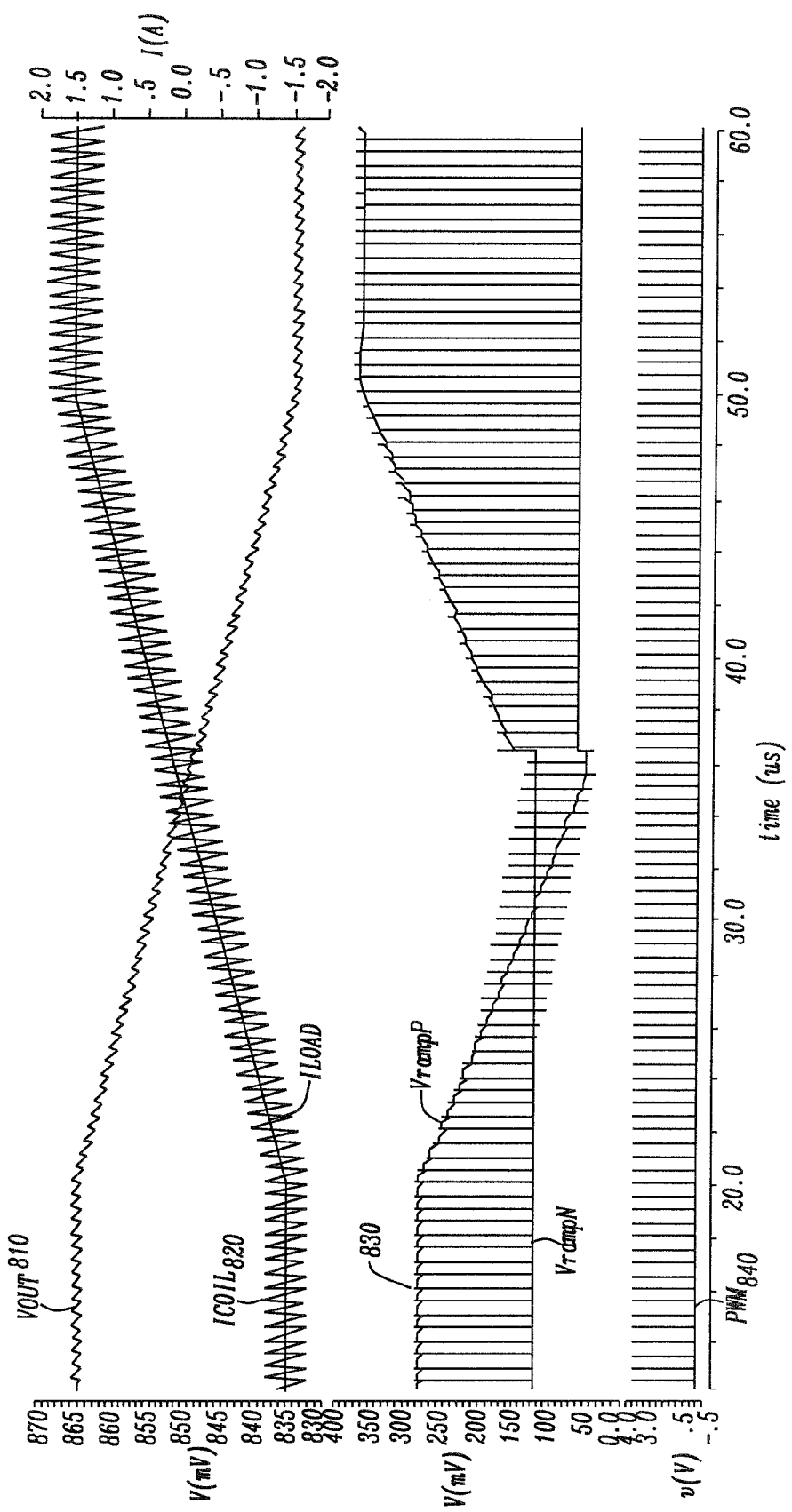
FIG. 8 is a chart schematically illustrating an example of a simulation result for the power converter exemplarily illustrated in FIG. 6.
Figure 9:
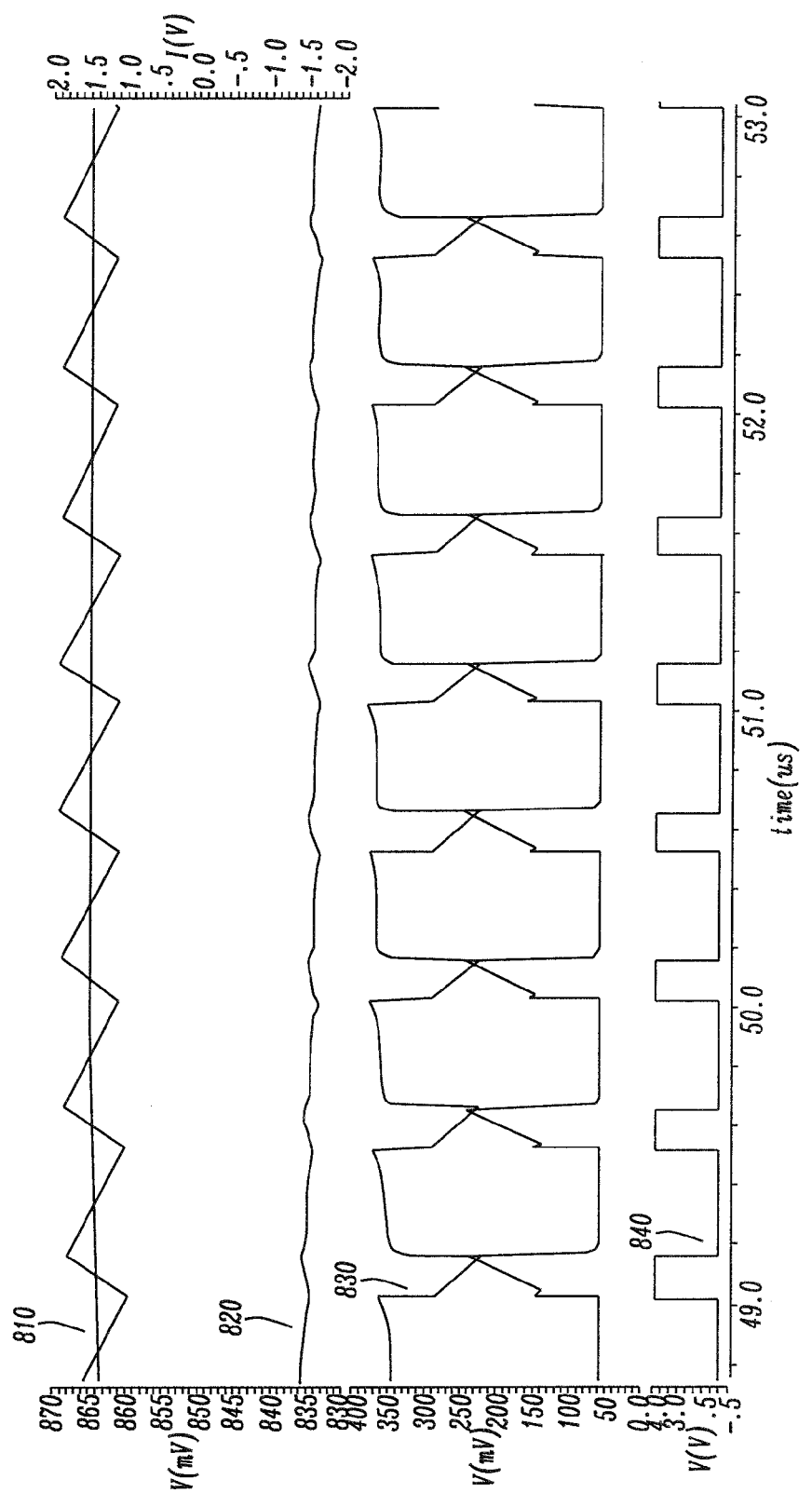
FIG. 9 and FIG. 10 are magnified sections of the chart of FIG. 8.
Figure 10:
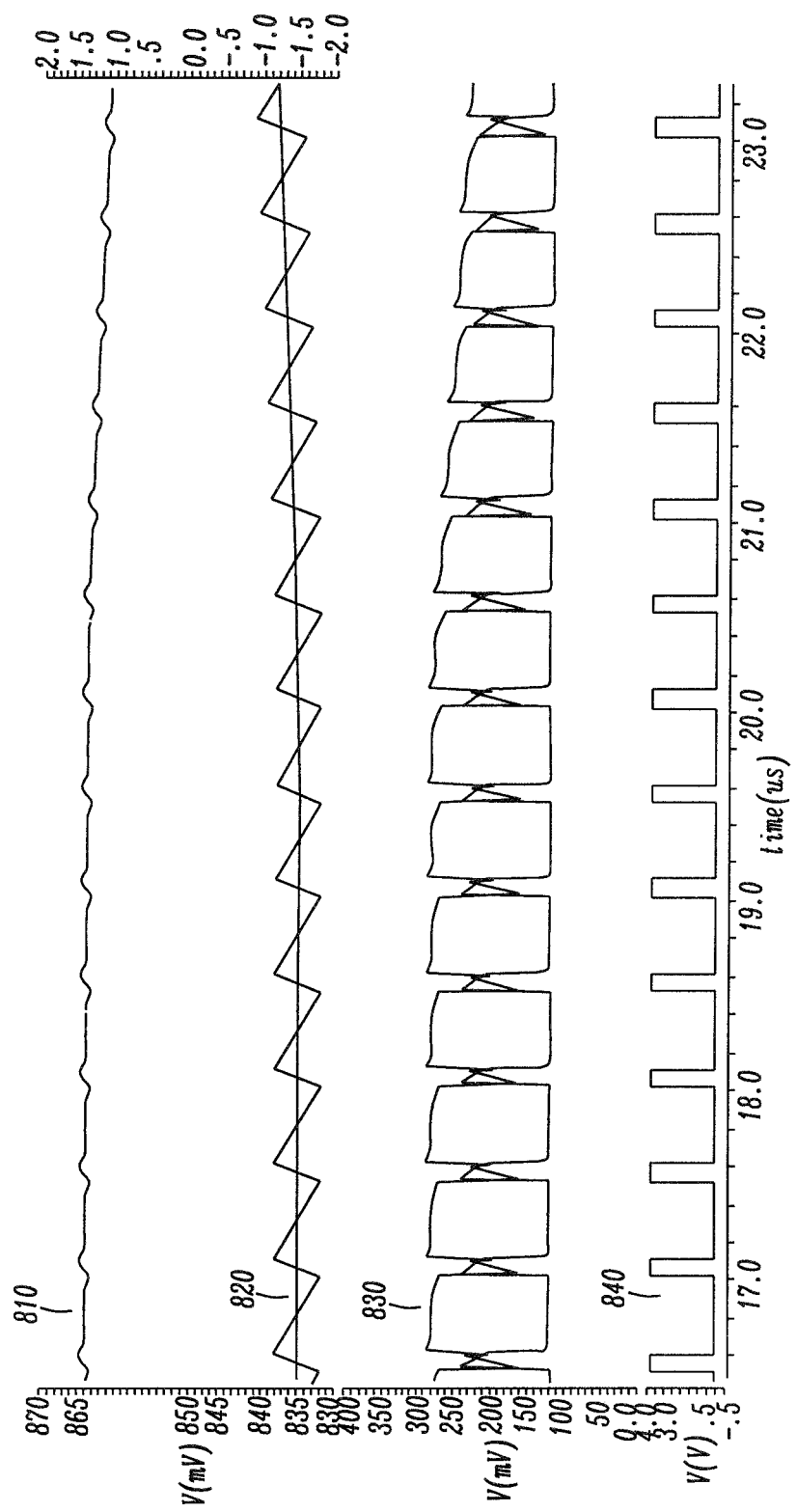

FIG. 8 is a chart schematically illustrating an example of a simulation result for the power converter 400. The uppermost graph 810 (on the left side of the chart) represents the load of the power converter 400, the second graph 820 from the top (on the left side of the chart) represents the output voltage of the power converter 400, the third graph 830 from the top represents the voltage at the first input terminal of the PWM comparator 430 (i.e. at the VrampP node in FIG. 6: lighter gray) and the voltage at the second input terminal of the PWM comparator 430 (i.e. at the VrampN node in FIG. 6: darker gray), and the lowermost graph 840 represents the PWM signal output by the PWM comparator 430. FIG. 9 is a magnified section of the chart of FIG. 8 for a positive load, and FIG. 10 is a magnified section of the chart of FIG. 8 for a negative load.

As can be seen from FIG. 8, for negative load (negative current) the voltage at the second input terminal of the PWM comparator 430 (the negative input terminal in FIG. 6) starts (approximately) from zero, and the starting point rises with positive loads by virtue of dynamic biasing by the second OTA 462. Likewise, the voltage at the first input terminal of the PWM comparator 430 (the positive input terminal in FIG. 6) starts from a constant value at positive loads and is dynamically biased by the first OTA 461 for negative currents. The flanks of the PWM signal are determined by the crossing points of the voltages at the VrampP and VrampN nodes in FIG. 6.

An advantage of the power converter 400 of FIG. 6 is that both the first current sensing circuit 440 and the second current sensing circuit 450 operate (i.e. sense the current conducted by the output device 420) simultaneously over the full load range (i.e. both for positive and negative currents) in a differential configuration. Accordingly, the system has an enhanced power supply rejection ratio (PSRR) compared to conventional power converters. At the same time, as indicated above, the quiescent current at zero load is very small compared to conventional power converters.

Figure 11:
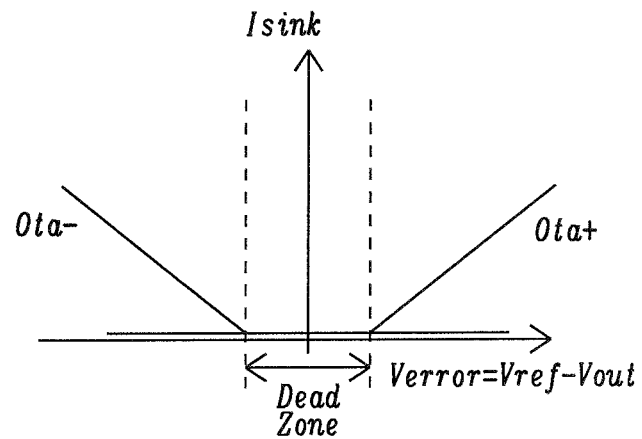
FIG. 11 schematically illustrates another example of a relationship between the dynamic bias currents and the difference between the reference voltage and the output voltage of the power converter exemplarily illustrated in FIG. 6.

As described above, FIGS. 7A and 7B schematically illustrate the transfer functions of the first and second OTAs 461, 462. In an ideal case, they are biased in class B and perfectly overlap at zero error voltage (Verror=0). However, in practice perfect class B biasing might not be achievable due to e.g. statistics, so that a situation might arise in which none of the first and second OTAs 461, 462 is working for some range of the error voltage. In such case, there would be a dead zone in the feedback control of the power converter 400 due to disoverlap of the transfer functions of the first and second OTAs 461, 462. This situation is illustrated in FIG. 11 which schematically illustrates another example of a relationship between the dynamic bias currents and the difference between the reference voltage and the output voltage of the power converter 400.

The potential problem of a dead zone explained with reference to FIG. 11 may be addressed by applying a constant bias in class AB to always ensure a minimum overlap between the transfer functions of the first and second OTAs 461, 462, thereby ensuring that at least one of the first and second OTAs 461, 462 is working for any value of the error voltage.

Figure 12:
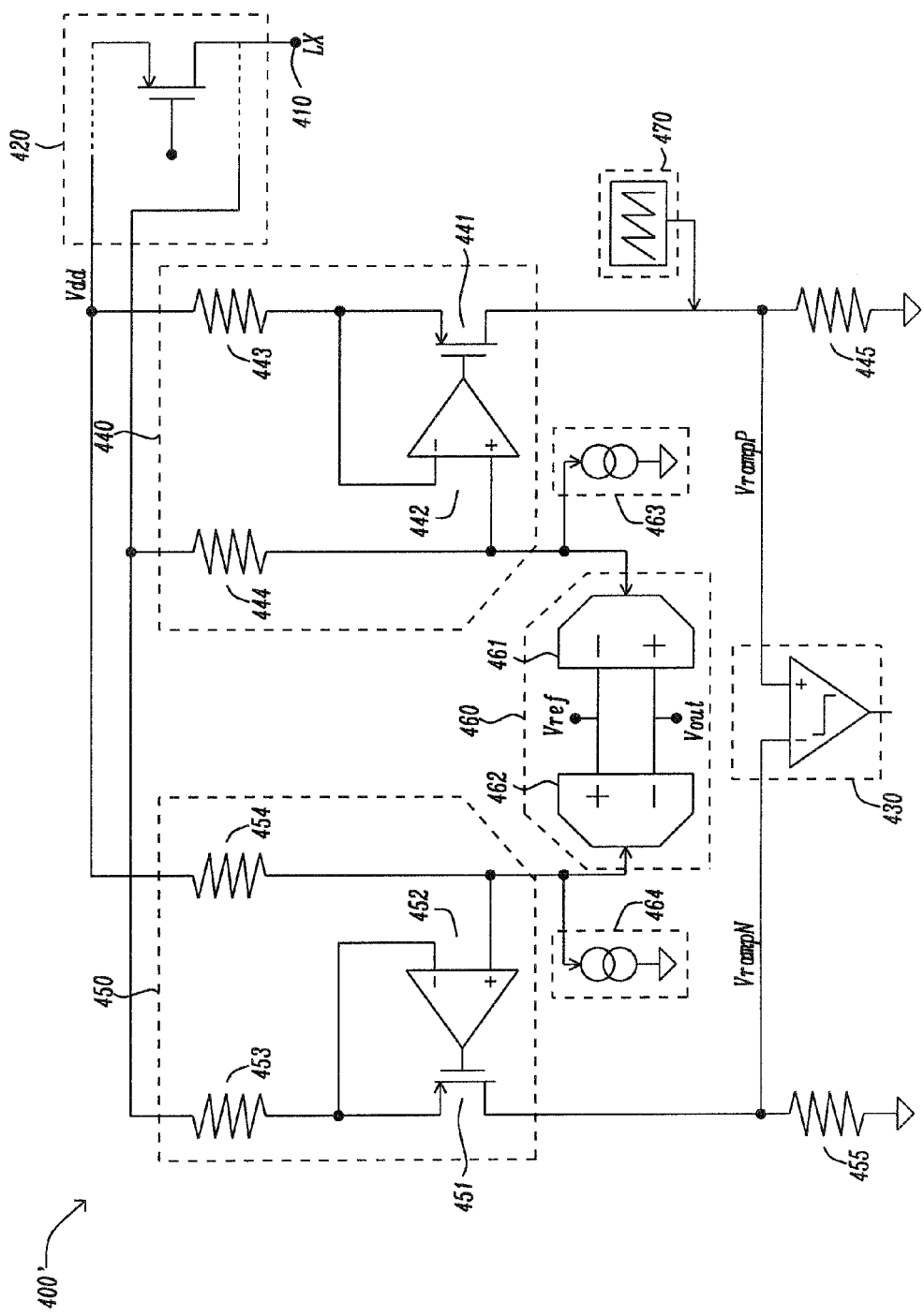
FIG. 12 schematically illustrates another example of a power converter according to embodiments of the disclosure.

FIG. 12 schematically illustrates an example of a modification 400' of the power converter 400 according to embodiments of the disclosure. The power converter 400' is identical to the power converter 400 of FIG. 6, with the exception that the power converter 400' further comprises first and second constant current generators 463, 464. The first constant current generator 463 is connected to the first current sensing circuit 440, more precisely to an intermediate node between the output terminal of the first OTA 461 and the positive input terminal of the first operational amplifier 442 of the first current sensing circuit 440, to bias the first current sensing circuit 440 by sinking a (small) first constant bias current. The second constant current generator 464 is connected to the second current sensing circuit 450, more precisely to an intermediate node between the output terminal of the second OTA 462 and the positive input terminal of the second operational amplifier 452 of the second current sensing circuit 450, to bias the second current sensing circuit 450 by sinking a (small) second constant bias current. Operation of the first and second constant current generators 463, 464 corresponds to that of the first and second constant current generators described above with reference to FIG. 1.

Figure 13:
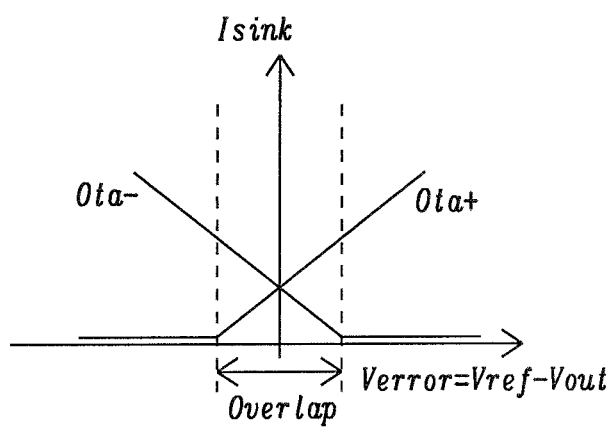
FIG. 13 schematically illustrates an example of a relationship between the dynamic bias currents and the difference between the reference voltage and the output voltage of the power converter exemplarily illustrated in FIG. 12.

Providing the first and second constant current generators 463, 464 and appropriately choosing the first and second constant bias currents results in the transfer functions of the first and second OTAs 461, 462 schematically illustrated in FIG. 13.

Figure 14:
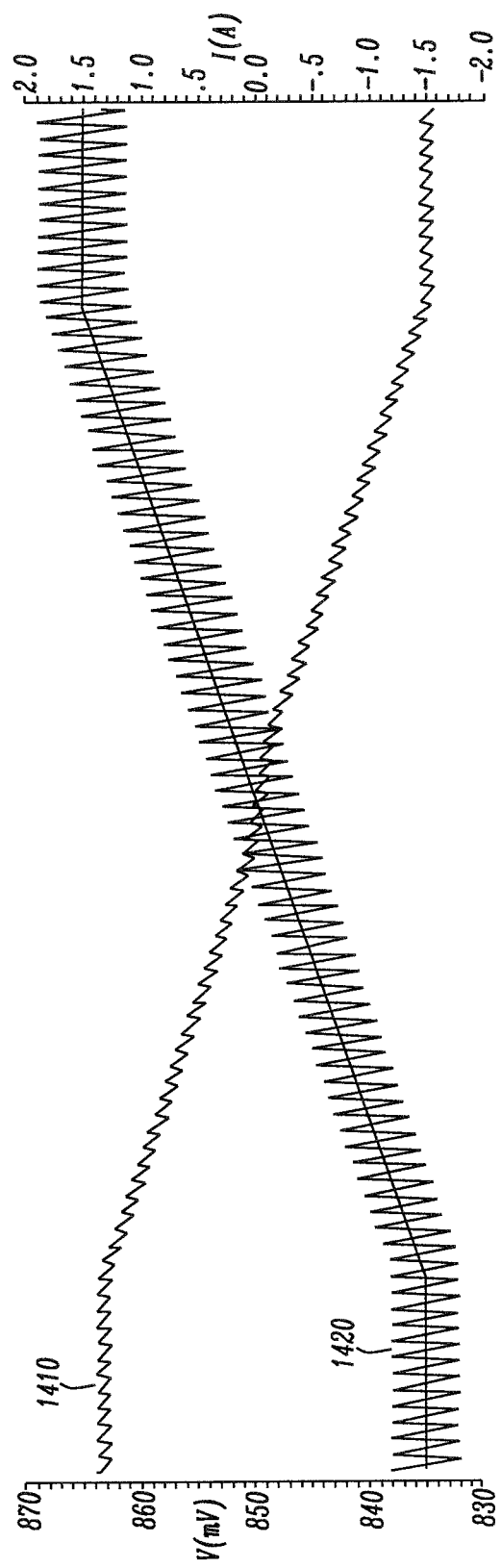
FIG. 14 is a chart schematically illustrating an example of a simulation result for the power converter exemplarily illustrated in FIG. 12.

One issue relating to the solution embodied by the power converter 400' of FIG. 12 is that the gain of the feedback loop doubles for the range of the error voltage in which the overlap between the transfer functions of the first and second OTAs 461, 462 occurs. This may impact stability of feedback control and distort the transfer function of the output voltage (Vout) versus the load current (Iload). This situation is illustrated in FIG. 14, which is a chart schematically illustrating a simulation result for the power converter 400' of FIG. 12. The uppermost graph 1410 (on the left side of the chart) represents the load of the power converter 400', the second graph 1420 from the top (on the left side of the chart) represents the output voltage of the power converter 400'. As can be seen from FIG. 14, the slope of the load is reduced in the overlap region.

Figure 15:
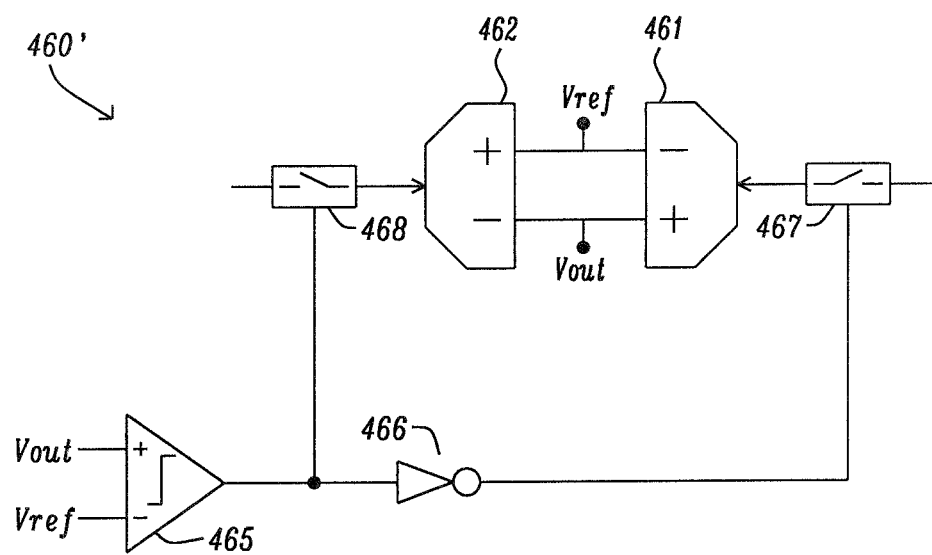
FIG. 15 schematically illustrates a detail of an example of a modification to the power converter exemplarily illustrated in FIG. 12.

This issue may be addressed by deciding between the output of the first and second OTAs 461, 462 at a fixed point by means of a comparator. FIG. 15 schematically illustrates a modification 460' of the differential OTA 460 in the power converter 400' of FIG. 12. The differential OTA 460' comprises the first and second OTAs 461, 462, as was the case for the differential OTA 460 in FIG. 12. In addition, the differential OTA 460' further comprises a first switch 467 and a second switch 468, as well as a PWM comparator 465 and an inverter 466. The reference voltage and the output voltage are supplied to the input terminals of the PWM comparator 465, which outputs a PWM signal in accordance with a sign of the error voltage. The first and second switches 467, 468 are configured to open and close in accordance with the PWM signal generated by the PWM comparator 465. The second switch 468 opens and closes in antiphase to the first switch. To this end, the PWM signal generated by the PWM comparator 465 may be supplied directly to the first switch 467, and may be fed to the inverter 466 before being supplied to the second switch 468 (or vice versa).

Figure 16:
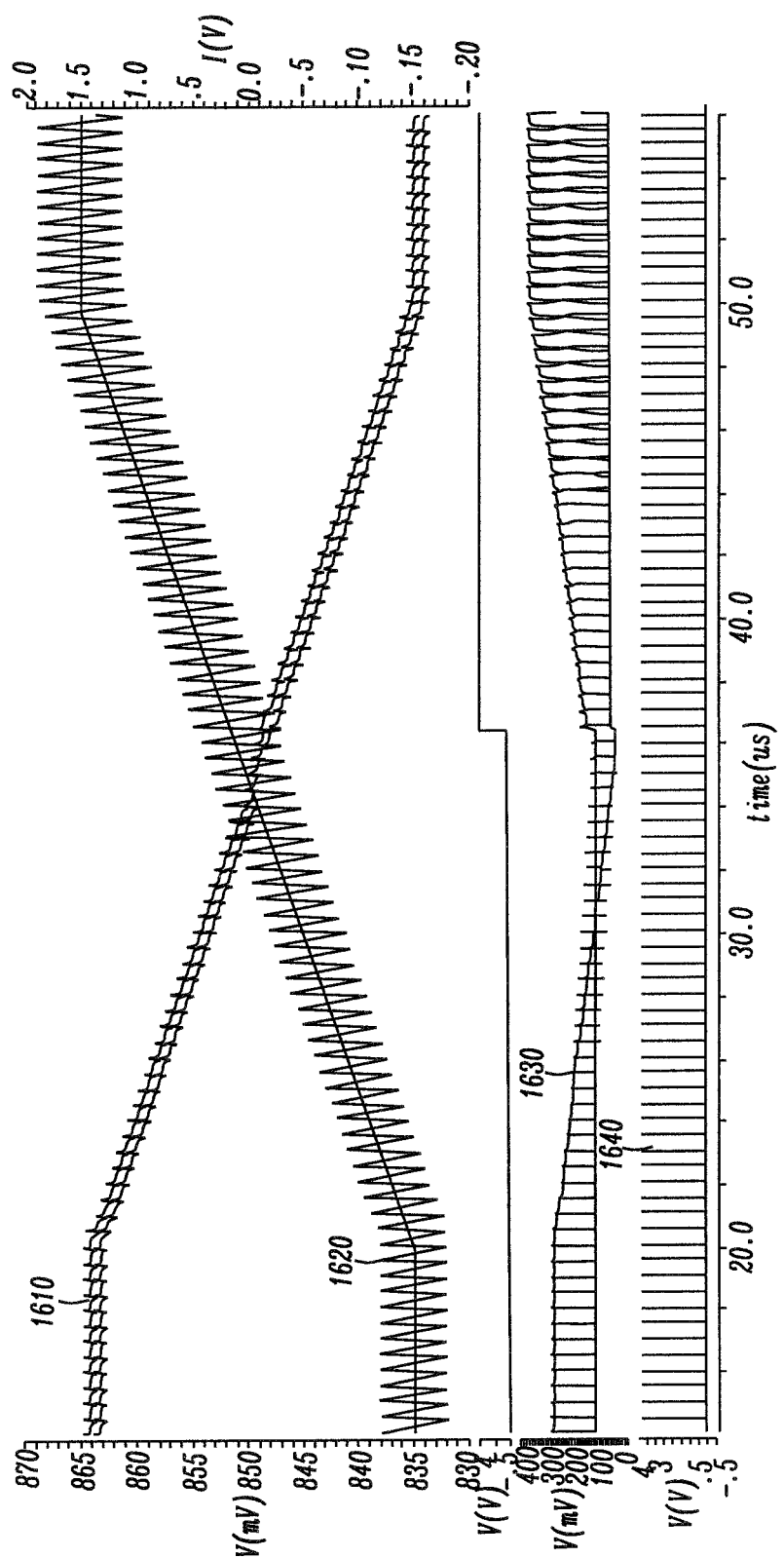
FIG. 16 is a chart schematically illustrating an example of a simulation result for the modification exemplarily illustrated in FIG. 15.

Accordingly, only one of the first and second OTAs 461, 462 is active at a given time, so that the gain of the feedback loop is not doubled in the overlap region. This is illustrated in FIG. 16, which is a chart schematically illustrating an example simulation result for the modification exemplarily illustrated in FIG. 15. At the same time, occurrence of a dead zone is still prevented. Similarly to FIG. 8, the uppermost graph 1610 (on the left side of the chart) in FIG. 16 represents the load, the second graph 1620 from the top (on the left side of the chart) represents the output voltage, the third graph 1630 from the top represents the voltage at the first input terminal of the PWM comparator 430 (i.e. at the VrampP node in FIG. 12: lighter gray) and the voltage at the second input terminal of the PWM comparator 430 (i.e. at the VrampN node in FIG. 12: darker gray), and the lowermost graph 1640 represents the PWM signal output by the PWM comparator 430.

Unless indicated otherwise, the above disclosure relates to the case of the output device being a PMOS transistor. As indicated above, the output device may also relate to an NMOS transistor. In this case, input terminals of respective operational amplifiers. PWM comparators and OTAs may need to be swapped, as the skilled person will appreciate. The present disclosure is understood to also encompass such configurations of the power converter in which the output device is an NMOS transistor and respective input terminals have been appropriately swapped with respect to the above-described case of the output device being a PMOS transistor.

Figure 17:
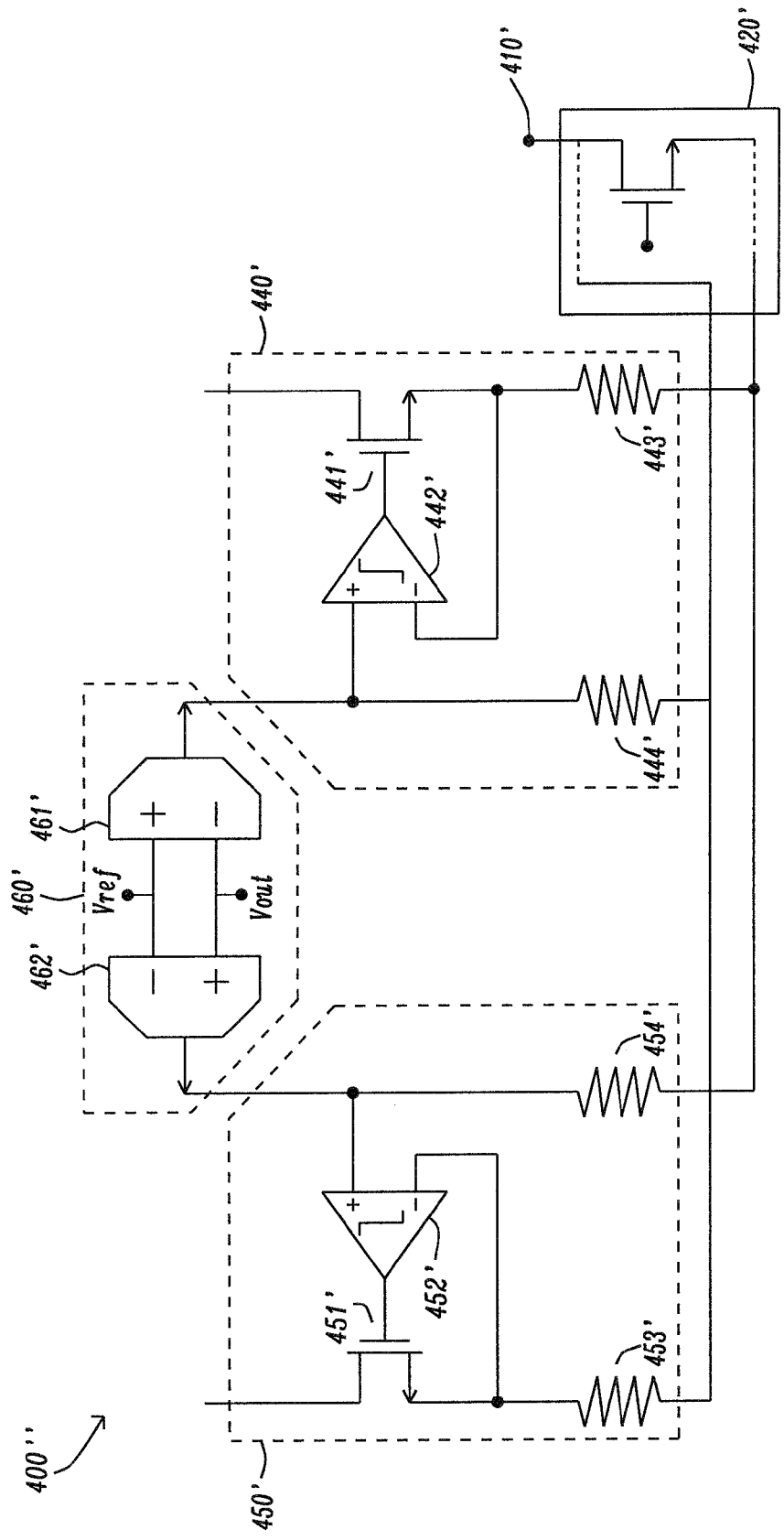
FIG. 17 schematically illustrates an example of an alternative configuration for the power converter exemplarily illustrated in FIG. 6.

For instance, FIG. 17 schematically illustrates an alternative configuration 400" for the power converter 400 that is exemplarily illustrated in FIG. 6. Entities referenced by primed reference numerals correspond to entities in FIG. 6 referenced by respective un-primed reference numerals and will not be described here, for reasons of conciseness. However, as can be seen from FIG. 17, the output device 420' is an NMOS transistor, and the output voltage and the reference voltage are supplied to the input terminals of the first and second OTAs 461, 462 in reverse order compared to the case of FIG. 6. In the power converter 400", the first and second OTAs 461, 462 push respective positive currents to the first and second current sensing circuits 440', 450', respectively.

It should be noted that the description and drawings merely illustrate the principles of the proposed apparatus. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed apparatus. Furthermore, all statements herein providing principles, aspects, and embodiments of the invention, as well as specific examples thereof, are intended to encompass equivalents thereof.

What is claimed is:

1. A power converter for converting a DC input voltage to a DC output voltage, the power converter comprising:
    an output node;
    a pass device connected to the output node of the power converter, the pass device being configured to operate in accordance with a PWM signal and to supply at least a portion of an output current of the power converter;
    a PWM comparator for generating the PWM signal for controlling operation of the pass device in accordance with a current conducted by the pass device and a difference between an output voltage of the power converter and a reference voltage, the PWM comparator having a first input terminal and a second input terminal;
    a first current sensing circuit for outputting a first sense current depending on the current conducted by the pass device, the first current sensing circuit being configured to sense the current conducted by the pass device if the current conducted by the pass device has a given polarity, the first current sensing circuit further being connected to the PWM comparator in such a manner that a voltage depending on the first sense current is supplied to the first input terminal of the PWM comparator; and
    a second current sensing circuit for outputting a second sense current depending on the current conducted by the pass device, the second current sensing circuit being configured to sense the current conducted by the pass device if the current conducted by the pass device has a polarity opposite to the given polarity, the second current sensing circuit further being connected to the PWM comparator in such a manner that a voltage depending on the second sense current is supplied to the second input terminal of the PWM comparator.

2. The power converter according to claim 1, wherein the first and second current sensing circuits are single-direction current sensing circuits.

3. The power converter according to claim 1,
    wherein the first current sensing circuit comprises:
    a first transistor, wherein a source terminal of the first transistor receives a first voltage depending on a voltage at a source terminal of the pass device; and
    a first operational amplifier, wherein an output terminal of the first operational amplifier is connected to a gate terminal of the first transistor, a positive input terminal of the first operational amplifier receives a second voltage depending on a voltage at a drain terminal of the pass device, and a negative input terminal of the first operational amplifier receives the first voltage depending on the voltage at the source terminal of the pass device; and
    wherein the second current sensing circuit comprises:
    a second transistor, wherein a source terminal of the second transistor receives a third voltage depending on the voltage at the drain terminal of the pass device; and
    a second operational amplifier, wherein an output terminal of the second operational amplifier is connected to a gate terminal of the second transistor, a negative input terminal of the second operational amplifier receives the third voltage depending on the voltage at the drain terminal of the pass device, and a positive input terminal of the second operational amplifier receives a fourth voltage depending on the voltage at the source terminal of the pass device.

4. The power converter according to claim 1, further comprising a ramp generator for generating a ramp signal, the ramp generator being connected to the PWM comparator in such a manner that a voltage depending on the ramp signal is supplied to one of the first and second input terminals of the PWM comparator.

5. The power converter according to claim 4, further comprising an error current generation circuit for generating an error current depending on the difference between the output voltage of the power converter and the reference voltage, wherein the error current generation circuit is connected to the PWM comparator in such a manner that a voltage depending on the error current is supplied to the other one of the first and second input terminals.

6. The power converter according to claim 1, further comprising:
    a bias current generation circuit for generating a first bias current depending on a difference between the output voltage of the power converter and the reference voltage and a second bias current depending on the difference between the output voltage of the power converter and the reference voltage, the first and second bias currents having opposite polarities,
    wherein the bias current generation circuit is connected to the first current sensing circuit to dynamically bias the first current sensing circuit by the first bias current in such a manner that the first current sensing circuit is biased to sense the current conducted by the pass device for a given range of the current conducted by the pass device for which the current conducted by the pass device has the polarity opposite to the given polarity; and
    the bias current generation circuit is connected to the second current sensing circuit to dynamically bias the second current sensing circuit by the second bias current in such a manner that the second current sensing circuit is biased to sense the current conducted by the pass device for a given range of the current conducted by the pass device for which the current conducted by the pass device has the given polarity.

7. A power converter for converting a DC input voltage to a DC output voltage, the power converter comprising:
    an output node;
    a pass device connected to the output node of the power converter, the pass device being configured to operate in accordance with a PWM signal and to supply at least a portion of an output current of the power converter;
    a PWM comparator for generating the PWM signal for controlling operation of the pass device in accordance with a current conducted by the pass device and a difference between an output voltage of the power converter and a reference voltage, the PWM comparator having a first input terminal and a second input terminal;

a first replica of the pass device, wherein a source terminal of the first replica is connected to a source terminal of the pass device, and a drain terminal of the first replica is connected to the PWM comparator in such a manner that a voltage depending on the current conducted by the first replica is supplied to the first input terminal of the PWM comparator;

a second replica of the pass device, wherein a source terminal of the second replica is connected to a drain terminal of the pass device, and a drain terminal of the second replica is connected to the PWM comparator in such a manner that a voltage depending on the current conducted by the second replica is supplied to the second input terminal of the PWM comparator;

a bias current generation circuit for generating a bias current depending on the difference between the output voltage of the power converter and the reference voltage;

a switchable circuit assembly for alternatingly connecting the bias current generation circuit to either the drain terminal of the first replica or the drain terminal of the second replica, the switchable circuit assembly being configured to connect the bias current generation circuit to the drain terminal of the first replica if the output voltage is above the reference voltage and to the drain terminal of the second replica if the output voltage is below the reference voltage.

8. The power converter according to claim 7,
wherein the bias current generation circuit comprises a first operational transconductance amplifier, OTA, and a second OTA;
the reference voltage is supplied to the positive terminal of the first OTA and the negative terminal of the second OTA;
the output voltage of the power converter is supplied to the negative terminal of the first OTA and the positive terminal of the second OTA;
the output terminal of the first OTA is switchably connected to the drain terminal of the first replica by the switchable circuit assembly; and
the output terminal of the second OTA is switchably connected to the drain terminal of the second replica by the switchable circuit assembly.

9. The power converter according to claim 8,
further comprising a comparator for generating a signal,
wherein the output voltage of the power converter is supplied to one of input terminals of the comparator;
the reference voltage is supplied to the other one of the input terminals of the comparator;
an output terminal of the comparator is connected to a controllable first switch connected between the output terminal of the first OTA and the drain terminal of the first replica, and the first switch is configured to open and close in accordance with the signal; and
the output terminal of the comparator is connected to a controllable second switch connected between the output terminal of the second OTA and the drain terminal of the second replica through an inverter, and the second switch is configured to open and close in accordance with the signal in antiphase with the first switch.

10. The power converter according to claim 7,
wherein the pass device, the first replica and the second replica are PMOS transistors; or
the pass device, the first replica and the second replica are NMOS transistors.

11. A power converter for converting a DC input voltage to a DC output voltage, the power converter comprising:
an output node;
a pass device connected to the output node of the power converter, the pass device being configured to operate in accordance with a PWM signal and to supply at least a portion of an output current of the power converter;
a PWM comparator for generating the PWM signal for controlling operation of the pass device in accordance with a current conducted by the pass device and a difference between an output voltage of the power converter and a reference voltage;
a current sensing circuit for outputting a sense current depending on the current conducted by the pass device, the current sensing circuit being configured to sense the current conducted by the pass device if the current conducted by the pass device has a given polarity, the current sensing circuit further being connected to the PWM comparator in such a manner that a voltage depending on the sense current is supplied to one of input terminals of the PWM comparator; and
a bias current generation circuit for generating a bias current depending on the difference between the output voltage of the power converter and the reference voltage, the bias current generation circuit being connected to the current sensing circuit to dynamically bias the current sensing circuit by the bias current in such a manner that the current sensing circuit is biased to sense the current conducted by the pass device for a given range of the current conducted by the pass device for which the current conducted by the pass device has a polarity opposite to the given polarity.

12. The power converter according to claim 11, wherein the current sensing circuit is a single-direction current sensing circuit.

13. The power converter according to claim 11,
wherein the current sensing circuit comprises:
a transistor, wherein a source terminal of the transistor receives a voltage depending on a voltage at a source terminal of the pass device; and
an operational amplifier, wherein an output terminal of the operational amplifier is connected to a gate terminal of the transistor, a positive input terminal of the operational amplifier receives a voltage depending on a voltage at a drain terminal of the pass device, and a negative input terminal of the operational amplifier receives the voltage depending on the voltage at the source terminal of the pass device.

14. The power converter according to claim 11 further comprising an error current generation circuit for generating an error current depending on the difference between the output voltage of the power converter and the reference voltage, wherein the error current generation circuit is connected to the PWM comparator in such a manner that a voltage depending on the error current is supplied to the other one of the input terminals of the PWM comparator.

15. The power converter according to claim 14, further comprising a ramp generator for generating a ramp signal, the ramp generator being connected to the PWM comparator in such a manner that a voltage depending on the compensation ramp signal is supplied to the one of the input terminals of the PWM comparator.

16. A method for converting a DC input voltage to a DC output voltage using a power converter, comprising the steps of:
provide an output node;
providing a pass device connected to the output node of the power converter, to operate in accordance with a PWM signal and to supply at least a portion of an output current of the power converter;
generating with a PWM comparator the PWM signal for controlling operation of the pass device in accordance with a current conducted by the pass device and a difference between an output voltage of the power converter and a reference voltage, the PWM comparator having a first input terminal and a second input terminal;
outputting a first sense current with a first current sensing circuit depending on the current conducted by the pass device, the first current sensing circuit used to sense the current conducted by the pass device if the current conducted by the pass device has a given polarity, the first current sensing circuit further being connected to the PWM comparator in such a manner that a voltage depending on the first sense current is supplied to the first input terminal of the PWM comparator; and
outputting a second sense current with a second current sensing circuit depending on the current conducted by the pass device, the second current sensing circuit used to sense the current conducted by the pass device if the current conducted by the pass device has a polarity opposite to the given polarity, the second current sensing circuit further being connected to the PWM comparator in such a manner that a voltage depending on the second sense current is supplied to the second input terminal of the PWM comparator.

17. The method according to claim 16, wherein the first and second current sensing circuits are single-direction current sensing circuits.

18. The method according to claim 16,
wherein the first current sensing circuit comprises:
a first transistor, wherein a source terminal of the first transistor receives a first voltage depending on a voltage at a source terminal of the pass device; and
a first operational amplifier, wherein an output terminal of the first operational amplifier is connected to a gate terminal of the first transistor, a positive input terminal of the first operational amplifier receives a second voltage depending on a voltage at a drain terminal of the pass device, and a negative input terminal of the first operational amplifier receives the first voltage depending on the voltage at the source terminal of the pass device; and
wherein the second current sensing circuit comprises:
a second transistor, wherein a source terminal of the second transistor receives a third voltage depending on the voltage at the drain terminal of the pass device; and
a second operational amplifier, wherein an output terminal of the second operational amplifier is connected to a gate terminal of the second transistor, a negative input terminal of the second operational amplifier receives the third voltage depending on the voltage at the drain terminal of the pass device, and a positive input terminal of the second operational amplifier receives a fourth voltage depending on the voltage at the source terminal of the pass device.

19. The method according to claim 16, further comprising the step of:
generating a ramp signal with a ramp generator which is connected to the PWM comparator in such a manner that a voltage depending on the ramp signal is supplied to one of the first and second input terminals of the PWM comparator.

20. The method according to claim 19, further comprising the step of:
generating an error current with a an error current generation circuit depending on the difference between the output voltage of the power converter and the reference voltage, wherein the error current generation circuit is connected to the PWM comparator in such a manner that a voltage depending on the error current is supplied to the other one of the first and second input terminals.

21. The method according to claim 16, further comprising the step of:
generating a first bias current with a first bias generation circuit, depending on a difference between the output voltage of the power converter and the reference voltage and a second bias current depending on the difference between the output voltage of the power converter and the reference voltage, the first and second bias currents having opposite polarities,
wherein the bias current generation circuit is connected to the first current sensing circuit to dynamically bias the first current sensing circuit by the first bias current in such a manner that the first current sensing circuit is biased to sense the current conducted by the pass device for a given range of the current conducted by the pass device for which the current conducted by the pass device has the polarity opposite to the given polarity; and
the bias current generation circuit is connected to the second current sensing circuit to dynamically bias the second current sensing circuit by the second bias current in such a manner that the second current sensing circuit is biased to sense the current conducted by the pass device for a given range of the current conducted by the pass device for which the current conducted by the pass device has the given polarity.

22. A method for converting a DC input voltage to a DC output voltage using a power converter, comprising the steps of:
providing an output node;
providing a pass device connected to the output node of the power converter, to operate in accordance with a PWM signal and to supply at least a portion of an output current of the power converter;
generating with a PWM comparator the PWM signal for controlling operation of the pass device in accordance with a current conducted by the pass device and a difference between an output voltage of the power converter and a reference voltage, the PWM comparator having a first input terminal and a second input terminal;
providing a first replica of the pass device, wherein a source terminal of the first replica is connected to a source terminal of the pass device, and a drain terminal of the first replica is connected to the PWM comparator in such a manner that a voltage depending on the current conducted by the first replica is supplied to the first input terminal of the PWM comparator;
providing a second replica of the pass device, wherein a source terminal of the second replica is connected to a drain terminal of the pass device, and a drain terminal of the second replica is connected to the PWM comparator in such a manner that a voltage depending on the current conducted by the second replica is supplied to the second input terminal of the PWM comparator;

providing a bias current generation circuit for generating a bias current depending on the difference between the output voltage of the power converter and the reference voltage;

providing a switchable circuit assembly for alternatingly connecting the bias current generation circuit to either the drain terminal of the first replica or the drain terminal of the second replica, the switchable circuit assembly used to connect the bias current generation circuit to the drain terminal of the first replica if the output voltage is above the reference voltage and to the drain terminal of the second replica if the output voltage is below the reference voltage.

23. The method according to claim 22, wherein the bias current generation circuit comprises a first operational transconductance amplifier, OTA, and a second OTA;

the reference voltage is supplied to the positive terminal of the first OTA and the negative terminal of the second OTA;

the output voltage of the power converter is supplied to the negative terminal of the first OTA and the positive terminal of the second OTA;

the output terminal of the first OTA is switchably connected to the drain terminal of the first replica by the switchable circuit assembly; and the output terminal of the second OTA is switchably connected to the drain terminal of the second replica by the switchable circuit assembly.

24. The method according to claim 23, further comprising the step of:

generating with a comparator a signal, wherein the output voltage of the power converter is supplied to one of input terminals of the comparator;

the reference voltage is supplied to the other one of the input terminals of the comparator;

an output terminal of the comparator is connected to a controllable first switch connected between the output terminal of the first OTA and the drain terminal of the first replica, and the first switch is used to open and close in accordance with the signal; and the output terminal of the comparator is connected to a controllable second switch connected between the output terminal of the second OTA and the drain terminal of the second replica through an inverter, and the second switch is used to open and close in accordance with the signal in antiphase with the first switch.

25. The method according to claim 22, wherein the pass device, the first replica and the second replica are PMOS transistors; or the pass device, the first replica and the second replica are NMOS transistors.

26. A method for converting a DC input voltage to a DC output voltage using a power converter, comprising the steps of:

providing an output node;

providing a pass device connected to the output node of the power converter, the pass device being configured to operate in accordance with a PWM signal and to supply at least a portion of an output current of the power converter;

generating with a PWM comparator the PWM signal for controlling operation of the pass device in accordance with a current conducted by the pass device and a difference between an output voltage of the power converter and a reference voltage;

outputting with a current sensing circuit a sense current depending on the current conducted by the pass device, the current sensing circuit used to sense the current conducted by the pass device if the current conducted by the pass device has a given polarity, the current sensing circuit further being connected to the PWM comparator in such a manner that a voltage depending on the sense current is supplied to one of input terminals of the PWM comparator; and generating with a bias current generation circuit a bias current depending on the difference between the output voltage of the power converter and the reference voltage, the bias current generation circuit being connected to the current sensing circuit to dynamically bias the current sensing circuit by the bias current in such a manner that the current sensing circuit is biased to sense the current conducted by the pass device for a given range of the current conducted by the pass device for which the current conducted by the pass device has a polarity opposite to the given polarity.

27. The method according to claim 26, wherein the current sensing circuit is a single-direction current sensing circuit.

28. The method according to claim 26, wherein the current sensing circuit comprises:

a transistor, wherein a source terminal of the transistor receives a voltage depending on a voltage at a source terminal of the pass device; and an operational amplifier, wherein an output terminal of the operational amplifier is connected to a gate terminal of the transistor, a positive input terminal of the operational amplifier receives a voltage depending on a voltage at a drain terminal of the pass device, and a negative input terminal of the operational amplifier receives the voltage depending on the voltage at the source terminal of the pass device.

29. The method according to claim 26 further comprising the step of:

generating with an error current generation circuit an error current depending on the difference between the output voltage of the power converter and the reference voltage, wherein the error current generation circuit is connected to the PWM comparator in such a manner that a voltage depending on the error current is supplied to the other one of the input terminals of the PWM comparator.

30. The method according to claim 29, further comprising the step of:

generating with a ramp generator a ramp signal, the ramp generator being connected to the PWM comparator in such a manner that a voltage depending on the compensation ramp signal is supplied to the one of the input terminals of the PWM comparator.

* * * * *